United States Patent
Choi et al.

(10) Patent No.: US 10,403,719 B2
(45) Date of Patent: Sep. 3, 2019

(54) THREE-DIMENSIONAL SEMICONDUCTOR MEMORY DEVICES

(71) Applicant: SAMSUNG ELECTRONICS CO., LTD., Suwon-si, Gyeonggi-do (KR)

(72) Inventors: Moorym Choi, Yongin-si (KR); Bongyong Lee, Suwon-si (KR); Junhee Lim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/723,694

(22) Filed: Oct. 3, 2017

(65) Prior Publication Data
US 2018/0151672 A1    May 31, 2018

(30) Foreign Application Priority Data

Nov. 29, 2016  (KR) .......................... 10-2016-0160747

(51) Int. Cl.
| | | |
|---|---|---|
| *H01L 27/00* | (2006.01) | |
| *H01L 29/10* | (2006.01) | |
| *H01L 27/11524* | (2017.01) | |
| *H01L 27/11556* | (2017.01) | |
| *H01L 27/1157* | (2017.01) | |
| *H01L 27/11582* | (2017.01) | |

(52) U.S. Cl.
CPC ...... *H01L 29/1037* (2013.01); *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | |
|---|---|---|
| 8,971,118 B2 | 3/2015 | Jin et al. |
| 9,153,705 B2 | 10/2015 | Zhang et al. |
| 9,209,244 B2 | 12/2015 | Shim et al. |
| 9,324,730 B2 | 4/2016 | Nam et al. |
| 9,362,306 B2 | 6/2016 | Park et al. |
| 2015/0137210 A1 | 5/2015 | Nam et al. |
| 2015/0194435 A1 | 7/2015 | Lee |
| 2015/0318301 A1* | 11/2015 | Lee ..................... H01L 29/7926 257/324 |
| 2016/0005745 A1 | 1/2016 | Kim et al. |
| 2016/0049423 A1 | 2/2016 | Yoo et al. |

FOREIGN PATENT DOCUMENTS

KR   2015-0116995 A   10/2015

\* cited by examiner

*Primary Examiner* — Reema Patel
(74) *Attorney, Agent, or Firm* — Lee & Morse, P.C.

(57) ABSTRACT

A three-dimensional semiconductor memory device includes common source regions, an electrode structure between the common source regions, first channel structures penetrating the electrode structure, and second channel structures between the first channel structures and penetrating the electrode structures. The electrode structure includes electrodes vertically stacked on a substrate. The first channel structures include a first semiconductor pattern and a first vertical insulation layer. The second channel structures include a second vertical insulation layer surrounding a second semiconductor pattern. The second vertical insulation layer has a bottom surface lower than a bottom surface of the first vertical insulation layer.

20 Claims, 36 Drawing Sheets

THREE-DIMENSIONAL SEMICONDUCTOR MEMORY DEVICES

CROSS-REFERENCE TO RELATED APPLICATIONS

Korean Patent Application No. 10-2016-0160747, filed on Nov. 29, 2016, and entitled: "Three-Dimensional Semiconductor Memory Devices," is incorporated by reference herein in its entirety.

BACKGROUND

1. Field

One or more embodiments described herein relate to a three-dimensional semiconductor memory device.

2. Description of the Related Art

In order to satisfy performance and cost demands, attempts are being made to increase the integration of semiconductor devices. The integration of a two-dimensional (or planar) semiconductor device is primarily based on the area occupied by its unit memory cells. Consequently, the size of fine patterns in such a device is a factor. However, extremely expensive processing equipment is needed to produce fine patterns. Recently, semiconductor memory devices having a three-dimensional arrangement of memory cells have been proposed.

SUMMARY

In accordance with one or more embodiments, a three-dimensional semiconductor memory device includes common source regions spaced apart from each other in a substrate and extending in a first direction; an electrode structure between the common source regions adjacent to each other and extending in the first direction, the electrode structure including electrodes vertically stacked on the substrate; first channel structures penetrating the electrode structure and including a first semiconductor pattern and a first vertical insulation layer; and second channel structures between the first channel structures adjacent to each other and penetrating the electrode structure, the second channel structures including a second semiconductor pattern and a second vertical insulation layer, wherein the second vertical insulation layer surrounds the second semiconductor pattern and extends between the substrate and a bottom surface of the second semiconductor pattern, and wherein the second vertical insulation layer has a bottom surface lower than a bottom surface of the first vertical insulation layer.

In accordance with one or more other embodiments, a three-dimensional semiconductor memory device includes first impurity layers extending in a first direction and spaced apart from each other, the first impurity layers including first impurities; a second impurity layer extending in the first direction between the first impurity layers adjacent to each other, the second impurity layer including second impurities different from the first impurities; an electrode structure between the first impurity layers adjacent to each other and covering the second impurity layer, the electrode structure including a plurality of electrodes vertically stacked on the substrate; first channel structures on the substrate between the first impurity layers and penetrating the electrode structure; and second channel structures on the second impurity layer and penetrating the electrode structure.

In accordance with one or more other embodiments, a three-dimensional semiconductor memory device which includes common source regions spaced apart from each other in a substrate and extending in a first direction; an electrode structure on the substrate between the common source regions adjacent to each other and including electrodes vertically stacked on the substrate; first channel structures penetrating the electrode structure and electrically connected to the substrate; and second channel structures between the first channel structures adjacent to each other and penetrating the electrode structure and electrically separated from the substrate.

In accordance with one or more other embodiments, a three-dimensional semiconductor memory device includes common source regions; vertically stacked electrodes between the common source regions; first channel structures adjacent the vertically stacked electrodes, each of the first channel structures including a first semiconductor pattern and a first vertical insulation layer; and second channel structures between adjacent ones of the first channel structures adjacent, each of the second channel structures including a second vertical insulation layer surrounding a second semiconductor pattern, a bottom surface of the second vertical insulation layer lower than a bottom surface of the first vertical insulation layer.

BRIEF DESCRIPTION OF THE DRAWINGS

Features will become apparent to those of skill in the art by describing in detail exemplary embodiments with reference to the attached drawings in which:

FIGS. 10, 12, and 14 are enlarged view embodiments of section B in FIGS. 9, 11, and 13, respectively.

FIGS. 25A to 29A stages in another embodiment of a method for fabricating a three-dimensional semiconductor memory device;

FIGS. 25B to 29B illustrate views along section line IV-IV' in FIGS. 25A to 29A, respectively, which correspond to stages in another embodiment of a method for fabricating a three-dimensional semiconductor memory device.

DETAILED DESCRIPTION

Figure 1:
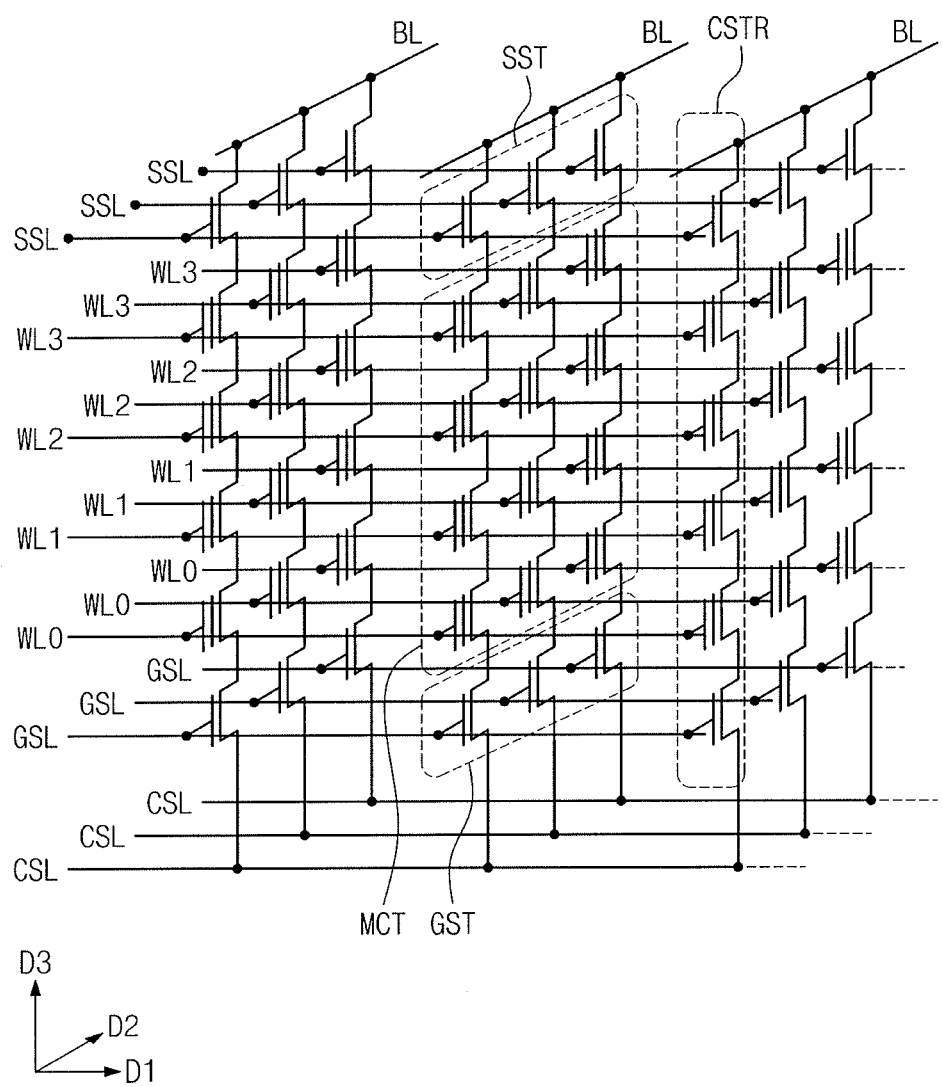
FIG. 1 illustrates an embodiment of a three-dimensional semiconductor memory device.

FIG. 1 illustrates an embodiment of a circuit diagram of a three-dimensional semiconductor memory device. Referring to FIG. 1, a cell array of a three-dimensional semiconductor memory device may include a common source line CSL, a plurality of bit lines BL, and a plurality of cell strings CSTR between the common source line CSL and the bit lines BL.

The bit lines BL may be arranged in a two-dimensional pattern, and a plurality of the cell strings CSTR may be connected in parallel to each of the bit lines BL. The cell strings CSTR may be connected in common to the common source line CSL. For example, a plurality of the cell strings CSTR may be between a plurality of the bit lines BL and one common source line CSL. In one embodiment, a plurality of common source lines CSL may be provided and arranged two-dimensionally. The common source lines CSL may be supplied with the same voltage or electrically controlled independently of each other.

Each cell string CSTR may include a ground selection transistor GST coupled to the common source line CSL, a string selection transistor SST coupled to the bit line BL, and a plurality of memory cell transistors MCT between the ground and string selection transistors GST and SST. The ground selection transistor GST, the string selection transistor SST, and the memory cell transistors MCT may be connected in series.

The common source line CSL may be connected in common to sources of the ground selection transistors GST. In addition, a ground selection line GSL, a plurality of word lines WL0 to WL3, and a plurality of string selection lines SSL between the common source line CSL and the bit lines BL may be used as gate electrodes of the ground selection transistor GST, the memory cell transistors MCT, and the string selection transistor SST, respectively. Each memory cell transistor MCT may include a data storage element.

Figure 2:
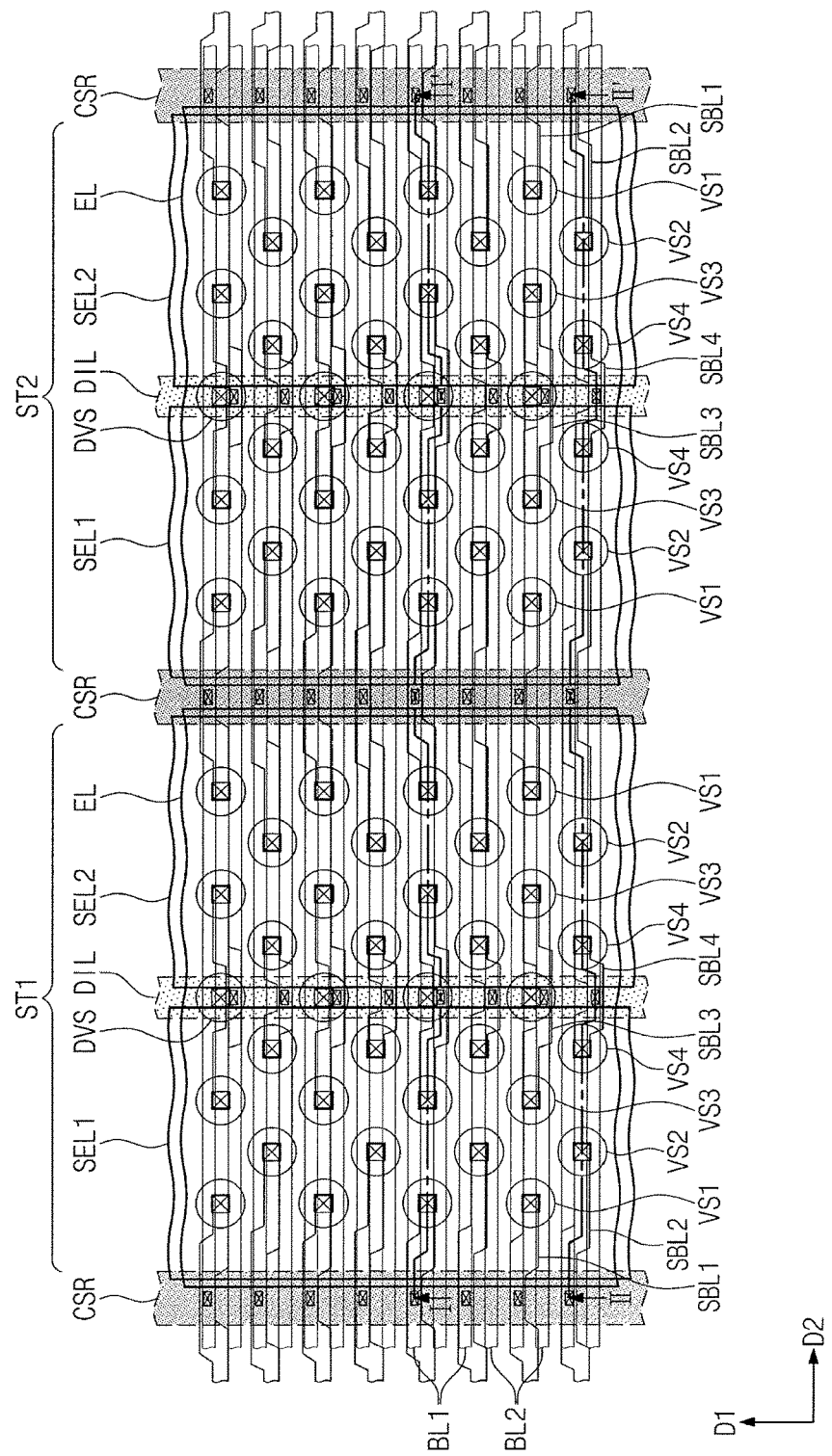
FIG. 2 illustrates a plan view of an embodiment of a cell array of the three-dimensional semiconductor memory device.
Figure 3:
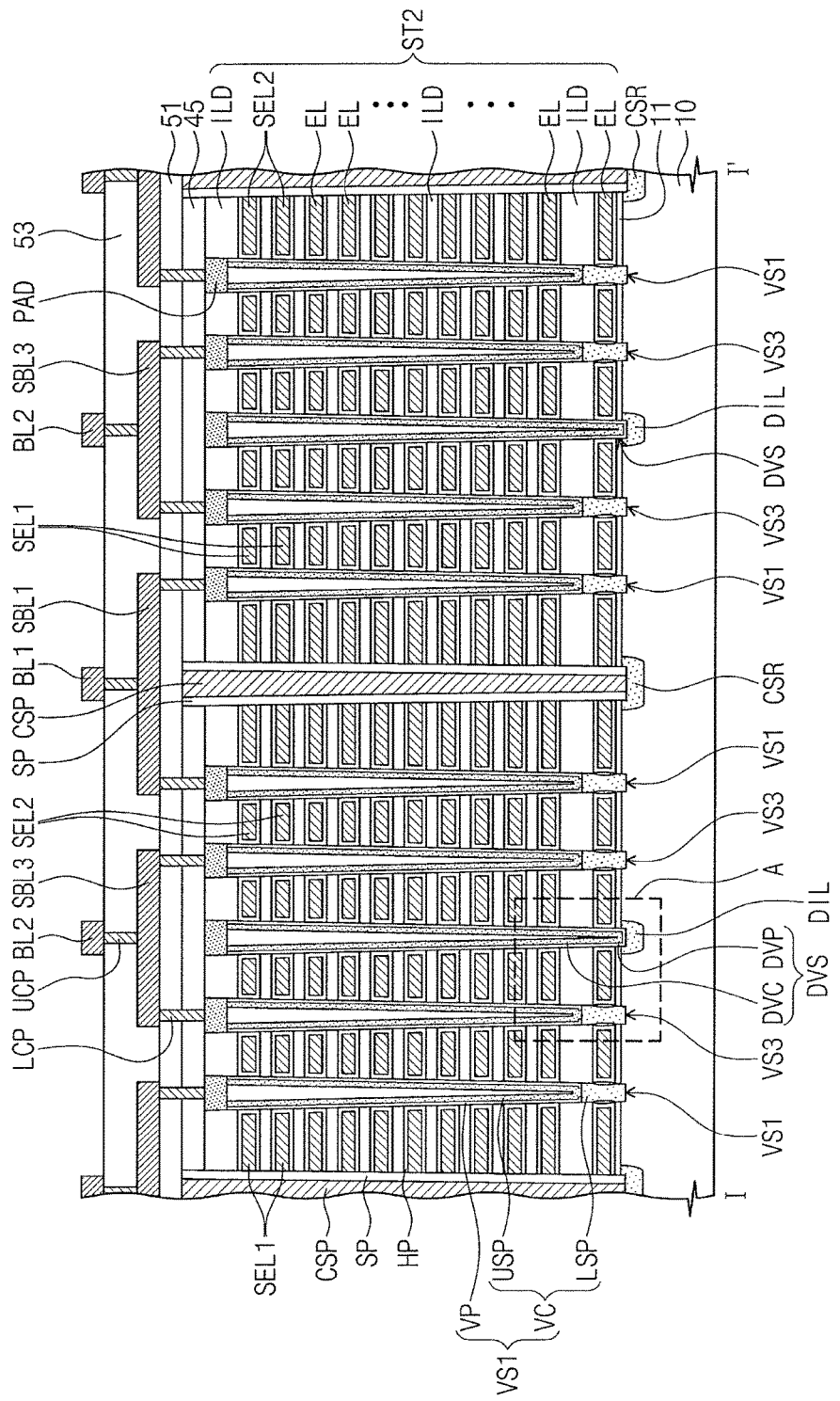
FIGS. 3 and 4 illustrate views along section lines I-I' and II-II' in FIG. 2.
Figure 4:
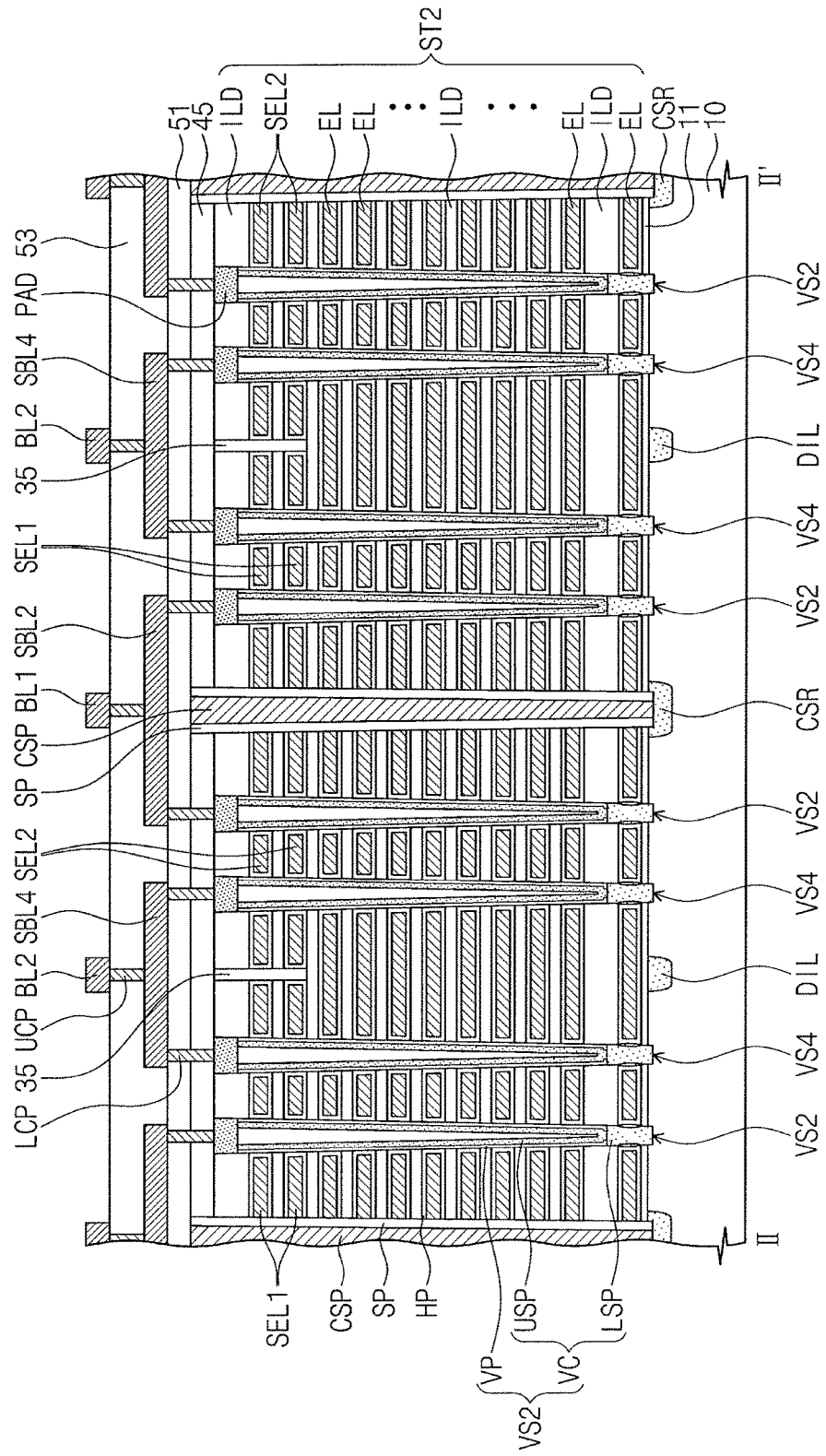

FIG. 2 illustrates a plan view embodiment of a cell array, which, for example, may be included in the three-dimensional semiconductor memory device of FIG. 1. FIGS. 3 and 4 illustrate cross-sectional views taken along lines I-I' and II-II' in FIG. 2, respectively. FIGS. 5A to 5D are enlarged view embodiments of section A in FIG. 3.

Referring to FIGS. 2, 3, and 4, a substrate 10 may include a plurality of common source regions CSR that extend in a first direction D1 and are spaced apart from each other in a second direction D2. The substrate 10 may be made of a material having semiconductor characteristics (e.g., silicon wafer), an insulating material (e.g., glass), a semiconductor covered with an insulating material, or a conductor. For example, the substrate 10 may be a silicon wafer having a first conductivity type.

The common source regions CSR may be regions where impurities are doped in the substrate 10. For example, the common source regions CSR may be formed by implanting the first conductive type substrate 10 with second conductive type impurities, for example, N-type impurities such as arsenic (As) or phosphor (P).

Dummy impurity layers DIL may be between the common source regions CSR adjacent to each other. The dummy impurity layers DIL may extend in parallel to the common source regions CSR in the first direction D1. The dummy impurity layers DIL may be impurity regions formed by implanting the substrate 10 with impurities such as, for example, carbon (C), nitrogen (N), or fluorine (F).

First and second electrode structures ST1 and ST2 may extend parallel to the first direction D1 on the substrate and spaced apart from each other in the second direction D2. Each of the first and second electrode structures ST1 and ST2 may include a plurality of electrodes EL that are vertically stacked and first and second string selection electrodes SEL1 and SEL2 that are horizontally spaced apart from each other on an uppermost one of the electrodes EL.

A buffer insulation layer 11 may be between the substrate 10 and a lowermost one of the electrodes EL. The first and second string selection electrodes SEL1 and SEL2 may be linearly separated from each other by a separation insulation pattern 35, extending in the first direction D1 between the first and second select electrodes SEL1 and SEL2.

The first and second electrode structures ST1 and ST2 may further include insulation layers ILD between the electrodes EL vertically adjacent to each other. The thicknesses of the insulation layers ILD may be different, for example, depending on characteristics of a semiconductor memory device. For example, the insulation layers ILD may have substantially the same thickness, or one or more of the insulation layers ILD may be thicker than other ones of the insulation layers ILD. In some embodiments, the insulation layers ILD may include a silicon oxide layer or a low-k dielectric layer.

In some embodiments, each of the electrode structures ST1 and ST2 may be between the common source regions CSR adjacent to each other. For example, each of the common source regions CSR may be in the substrate 10 between the first and second electrode structures ST1 and ST2, and may extend in parallel to the first and second electrode structures ST1 and ST2 in the first direction D1. In some embodiments, the dummy impurity layers DIL may be covered with the first and second electrode structures ST1 and ST2 on the substrate 10.

Each of the first and second electrode structures ST1 and ST2 may be penetrated by a plurality of first to fourth channel structures VS1, VS2, VS3, and VS4 and dummy channel structures DVS. A conductive pad PAD may be at a top end of each of the first to fourth channel structures VS1 to VS4 and the dummy channel structures DVS. The conductive pad PAD may be an impurity doped region or may include conductive material.

For example, the first to fourth channel structures VS1 to VS4 may penetrate each of the first and second string selection electrodes SEL1 and SEL2. The first to fourth channel structures VS1 to VS4 may be sequentially spaced apart from the common source region CSR by a horizontal distance (e.g., a distance in the second direction D2) that increases in the foregoing sequence. The first channel structures VS1 may be on a first column along the first direction D1. The second channel structure VS2 may be on a second column along the first direction D1. The third channel structures VS3 may be on a third column along first direction D1. The fourth channel structures VS4 may be on a fourth column along the first direction D1. The first and third channel structures VS1 and VS3 may be arranged in an oblique direction relative to the second and fourth channel structures VS2 and VS4. The first to fourth channel structures VS1 to VS4 penetrating the first and second string selection electrodes SEL1 and SEL2 may be arranged to have a mirror symmetry across the separation insulation pattern 35 (or the dummy channel structures DVS arranged in the first direction D1).

The first to fourth channel structures VS1 to VS4 may penetrate the first and second electrode structures ST1 and ST2 and contact the substrate 10. Each of the first to fourth channel structures VS1 to VS4 may include a vertical channel pattern VC and a first vertical insulation pattern VP surrounding the vertical channel pattern VC. The vertical channel pattern VC may be electrically connected to a well impurity layer having a first conductivity type in the substrate 10. The vertical channel patterns VC of the first to fourth channel structures VS1 to VS4 may have a hollow pipe shape or a macaroni shape with a closed bottom end. In an embodiment, the first to fourth channel structures VS1 to VS4 may have a cylindrically shaped, vertical channel pattern VC.

The dummy channel structures DVS may penetrate the first and second electrode structures ST1 and ST2 and contact the dummy impurity layer DIL in the substrate 10. The dummy channel structures DVS may be on the dummy impurity layer DIL and may vertically extend between the first and second string selection electrodes SEL1 and SEL2.

In a plan view, the dummy channel structures DVS may be spaced apart from each other along the first direction D1. The dummy channel structures DVS may be spaced apart from the common source regions CSR by a first horizontal distance. The first to fourth channel structures VS1 to VS4 may be spaced apart from the common source regions CSR by corresponding horizontal distances, which are less than the first horizontal distance. The dummy channel structures DVS may have lower widths substantially the same as the first to fourth channel structures VS1 to VS4, and upper widths substantially the same as the first to fourth channel structures VS1 to VS4.

Each of the dummy channel structures DVS may include a dummy vertical channel pattern DVS and a second vertical insulation pattern DVP surrounding the dummy vertical channel pattern DVS. The dummy vertical channel pattern DVS may include the same material as the vertical channel pattern VC. The second vertical insulation pattern DVP may be between the dummy impurity layer DIL and a bottom surface of the dummy vertical channel pattern DVC. In this configuration, the dummy vertical channel pattern DVC may be electrically separated or insulated from the substrate 10. Thus, it may be possible to prevent leakage current through the dummy vertical channel pattern DVC, even when dielectric breakdown occurs at the second vertical insulation pattern DVP during repetitive operation of a three-dimensional semiconductor memory device or when a defect exists in the second vertical insulation pattern DVP during fabrication process.

FIGS. 5A to 5D illustrate embodiments of the first to fourth channel structures VS1 to VS4 and the dummy channel structures DVS.

Sidewall insulation spacers SP may be on opposite sidewalls of each of the first and second electrode structures ST1 and ST2. The sidewall insulation spacers SP may face each other between neighboring first and second electrode structures ST1 and ST2. In one embodiment, the sidewall insulation spacer SP may fill between the first and second electrode structures ST1 and ST2 adjacent to each other.

A common source plug CSP may be between the first and second electrode structures ST1 and ST2, so that the common source region CSR may be coupled to the common source plug CSP. For example, the common source plug CSP may have a substantially uniform upper width and extend in parallel to the first direction D1. For example, the sidewall insulation spacers SP may be between the common source plug CSP and the opposite sidewalls of the first and second electrode structures ST1 and ST2. In one embodiment, the common source plug CSP may penetrate the sidewall insulation spacer SP to locally couple with the common source region CSR.

A capping insulation pattern 45 may be on the first and second electrode structures ST1 and ST2 to cover top surfaces of the conductive pads PAD of the first to fourth channel structures VS1 to VS4 and the dummy channel structures DVS. A first interlayer dielectric layer 51 may be on the capping insulation pattern 45 and may cover a top surface of the common source plug CSP.

The first interlayer dielectric layer 51 may be provided on the capping insulation pattern 45, along with first, second, third, and fourth subsidiary lines SBL1, SBL2, SBL3, and SBL4. The first to fourth subsidiary lines SBL1 to SBL4 may have their own major axes in the second direction D2.

The first subsidiary line SBL1 may be electrically connected to the first channel structures VS1 of the first and second electrode structures ST1 and ST2 through a lower contact LCP. The second subsidiary line SBL2 may be electrically connected to the second channel structures VS2 of the first and second electrode structures ST1 and ST2 through other lower contact LCP. For example, the first and second subsidiary lines SBL1 and SBL2 may be on the first and second electrode structures ST1 and ST2 and run across the common source region CSR. The second subsidiary line SBL2 may be longer than the first subsidiary line SBL1 in the second direction D2.

The third subsidiary line SBL3 may be electrically connected to the third channel structures VS3 penetrating the first and second string selection electrodes SEL1 and SEL2 in each of the first and second electrode structures ST1 and ST2. The fourth subsidiary line SBL4 may be electrically connected to the fourth channel structures VS4 penetrating the first and second string selection electrodes SEL1 and SEL2 in each of the first and second electrode structures ST1 and ST2. For example, the third and fourth subsidiary lines SBL3 and SBL4 may be on each of the first and second electrode structures ST1 and ST2 and run across the separation insulation pattern 35 in each of the first and second electrode structures ST1 and ST2. The third subsidiary line SBL3 may be longer than the fourth subsidiary line SBL4 in the second direction D2.

The first interlayer dielectric layer 51 may be provided thereon with a second interlayer dielectric layer 53 covering the first to fourth subsidiary lines SBL1 to SBL4. First and second bit lines BL1 and BL2 may be on the second interlayer dielectric layer 53. The first and second bit lines BL1 and BL2 may extend in the second direction D2 and be alternately disposed along the first direction D1.

The first bit line BL1 may be connected to the first or second subsidiary lines SBL1 or SBL2 through an upper contact UCP. The second bit line BL2 may be connected to the third or fourth subsidiary lines SBL3 or SBL4 through other upper contact UCL.

In some embodiments, a three-dimensional semiconductor memory device may be the vertical NAND Flash memory device discussed with reference to FIG. 1. For example, potentials of the vertical channel patterns VC of the first to fourth channel structures VS1 to VS4 may be controlled by the first and second string selection electrodes SEL1 and SEL2 and the electrodes EL of the first and second electrode structures ST1 and ST2. Current paths between the common source region CSR and the bit lines BL1 and BL2 may be created in the first to fourth channel structures VS1 to VS4. When the vertical NAND Flash memory device is operated, no current paths may be created between the common source region CSR and the dummy vertical channel patterns VC of the dummy channel structures DVS, e.g., the dummy vertical channel patterns VC may be electrically floated.

On the first and second electrode structures ST1 and ST2, uppermost ones of the first and second string selection electrodes SEL1 and SEL2 may be used as gate electrodes of string selection transistors (e.g., SST of FIG. 2) that control electrical connections between the bit line BL and the first to fourth channel structures VS1 to VS4. Lowermost ones of the electrodes EL may be used as gate electrodes of ground selection transistors (e.g., GST of FIG. 2) that control electrical connections between the common source region CSR and the first to fourth channel structures VS1 to VS4. The electrodes EL between the uppermost and lowermost electrodes may be used as control gate electrodes of memory cell transistors (e.g., MCT of FIG. 2) and word lines connecting the control gate electrodes.

Figure 5A:
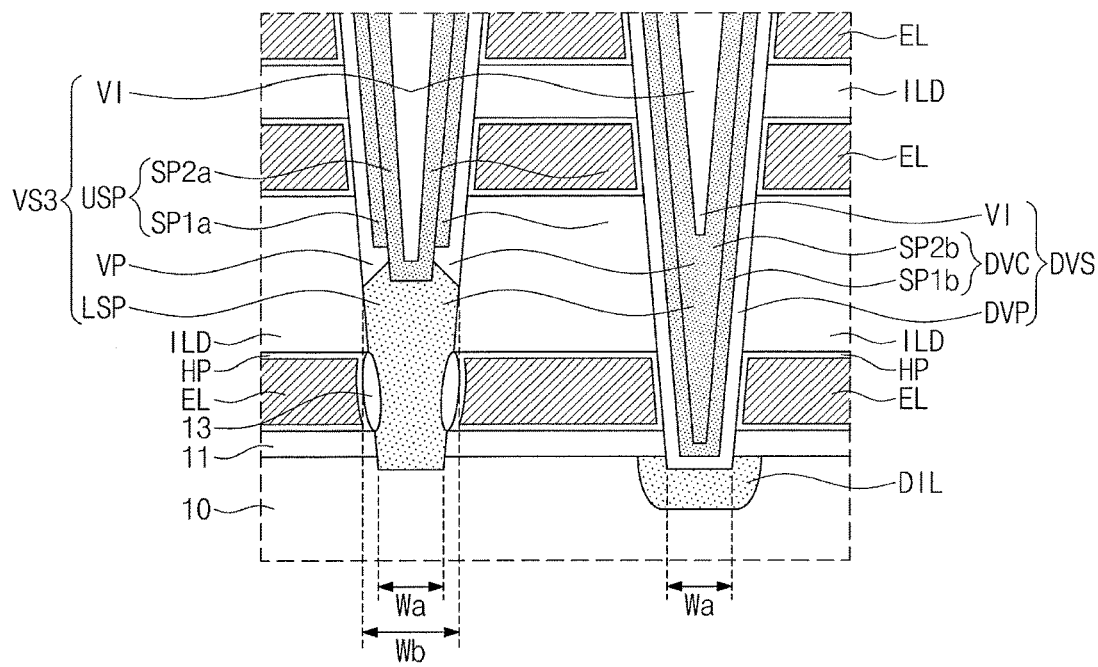
FIGS. 5A to 5D illustrate enlarged view embodiments of section A of FIG. 3.
Figure 5B:
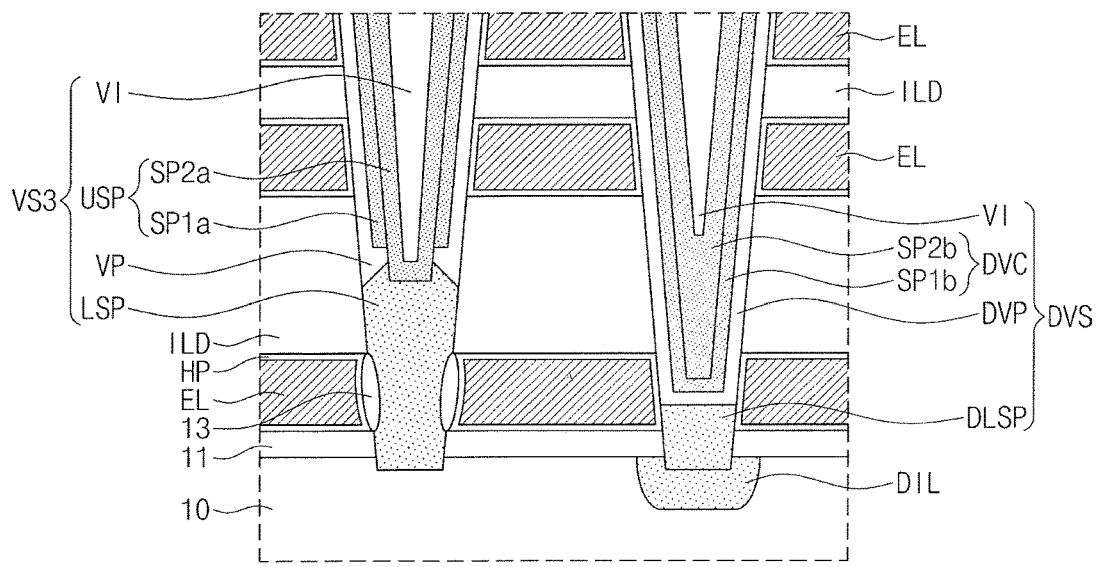
Figure 5C:
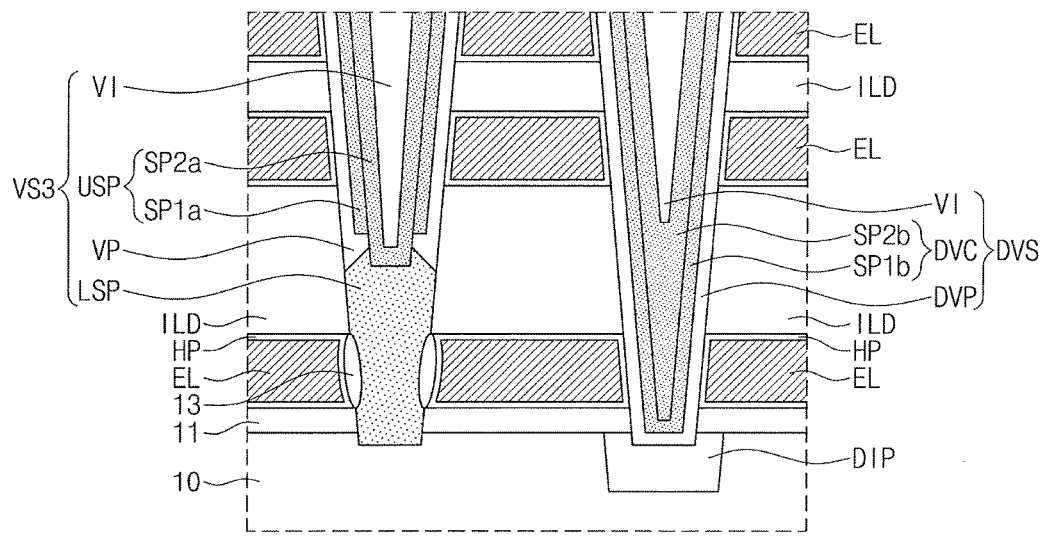
Figure 5D:
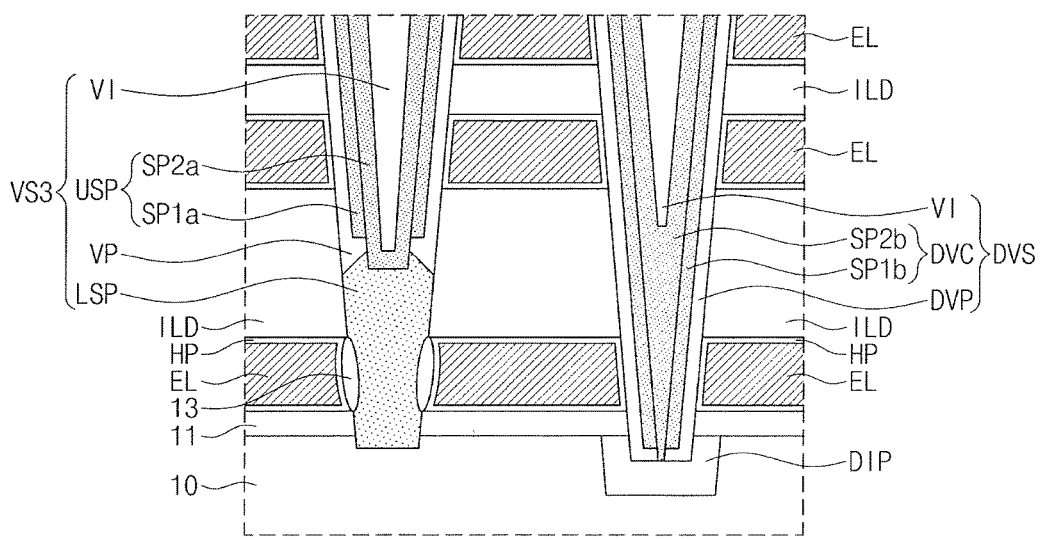

Referring to FIGS. 5A and 5D, as discussed above, each of the first to fourth channel structures VS1 to VS4 may include the vertical channel pattern (e.g., VC of FIG. 3) and the first vertical insulation pattern VP. The vertical channel pattern VC may include a lower semiconductor pattern LSP and an upper semiconductor pattern USP.

The lower semiconductor pattern LSP may penetrate a lower portion of the electrode structure ST to couple with the substrate 10. The lower semiconductor pattern LSP may have, for example, a pillar shape penetrating the lowermost electrode EL. The lower semiconductor pattern LSP may have a bottom surface lower than a top surface of the substrate 10 and a top surface higher than a top surface of the lowermost electrode EL. In some embodiments, the lower width Wa of the lower semiconductor pattern LSP may be less than its upper width Wb.

The lower semiconductor pattern LSP may include the semiconductor material as the substrate 10. For example, the lower semiconductor pattern LSP may be an epitaxial pattern formed by a laser crystallization technology or epitaxial technology using the substrate 10 as a seed. In this case, the lower semiconductor pattern LSP may have a single crystalline structure or a polycrystalline structure with a grain size greater than that of a structure formed by chemical vapor deposition. In one embodiment, the lower semiconductor pattern LSP may include a polycrystalline semiconductor material (e.g., polycrystalline silicon). A thermal oxide layer 13 may be between the lower semiconductor pattern LSP and the lowermost electrode EL.

The upper semiconductor pattern USP may penetrate an upper portion of the electrode structure ST to be coupled to the lower semiconductor pattern LSP. The upper semiconductor pattern USP may include a first semiconductor pattern SP1a, a second semiconductor pattern SP2a, and a filling insulation layer VI. The first semiconductor pattern SP1a may be spaced apart from the lower semiconductor pattern LSP across the first vertical insulation pattern VP, and may have a macaroni noodle or pipe shape with open top and bottom ends. The second semiconductor pattern SP2a may be a macaroni noodle or hollow pipe shape with a closed bottom end. The second semiconductor pattern SP2a may have an interior space filled with the filling insulation layer VI. The second semiconductor pattern SP2a may be in contact with an inner sidewall of the first semiconductor pattern SP1a and the top surface of lower semiconductor pattern LSP. In this configuration, the second semiconductor pattern SP2a may electrically connect the first semiconductor pattern SP1a to the lower semiconductor pattern LSP. The second semiconductor pattern SP2a may have a bottom surface lower than the top surface of the lower semiconductor pattern LSP. The first and second semiconductor patterns SP1a and SP2a may be undoped or doped with impurities having the same conductivity as the substrate 10. The first and second semiconductor patterns SP1a and SP2a may be polycrystalline or single crystalline.

The first vertical insulation pattern VP may be on the lower semiconductor pattern LSP and surround a sidewall of the upper semiconductor pattern USP. The first vertical insulation pattern VP may have a bottom surface spaced apart the substrate 10. The first vertical insulation pattern VP may include a data storage layer that stores data in a NAND Flash memory device. For example, the first vertical insulation pattern VP may include a tunnel insulation layer, a charge storage layer, and a blocking insulation layer that constitute the data storage layer.

Referring to FIG. 5A, as discussed above, each of the dummy channel structures DVS may include the dummy vertical channel pattern DVC and the second vertical insulation pattern DVP. The second vertical insulation pattern DVP may include the same material as the first vertical insulation pattern VP. For example, the second vertical insulation pattern DVP may include a data storage layer that stores data in a NAND Flash memory device. The data storage layer may include a tunnel insulation layer, a charge storage layer, and a blocking insulation layer.

In some embodiments, the second vertical insulation pattern DVP may have a bottom surface lower than the bottom surface of the first vertical insulation pattern VP and the top surface of the lowermost electrode EL. The second vertical insulation pattern DVP may surround a sidewall and a bottom surface of the dummy vertical channel pattern DVC. The second vertical insulation pattern DVP may extend between the dummy impurity layer DIL and the bottom surface of the dummy vertical channel pattern DVC from the sidewall of the dummy vertical channel pattern DVC. In this configuration, the dummy vertical channel pattern DVC may be spaced apart from both the dummy impurity layer DIL and the substrate 10 across the second vertical insulation pattern DVP.

The dummy vertical channel pattern DVC may include a first dummy semiconductor pattern SP1b, a second dummy semiconductor pattern SP2b, and a filling insulation layer VI. The first dummy semiconductor pattern SP1b may have a bottom surface lower than bottom surfaces of the first and second semiconductor patterns SP1a and SP2a. The first dummy semiconductor pattern SP1b may have a uniform thickness on the second vertical insulation pattern DVP. The second dummy semiconductor pattern SP2b may have a pipe shape with a closed bottom end and may fill a lower portion of the first dummy semiconductor pattern SP1b.

Referring to FIG. 5B, each of the dummy channel structures DVS may further include a dummy lower semiconductor pattern DLSP in addition to the dummy vertical channel pattern DVC and the second vertical insulation pattern DVP. In this case, the second vertical insulation pattern DVP may extend between the bottom surface of the dummy vertical channel pattern DVC and a top surface of the dummy lower semiconductor pattern DLSP from the sidewall of the dummy vertical channel pattern DVC. In this configuration, the dummy vertical channel pattern DVC may be spaced apart from the dummy lower semiconductor pattern DLSP. The dummy lower semiconductor pattern DLSP may include a semiconductor material having the same conductivity as the substrate 10, and may be an epitaxial pattern formed, for example, a laser crystallization technology or epitaxial technology using the substrate 10 as a seed. The top surface of the dummy lower semiconductor pattern DLSP may be lower than the top surfaces of the lower semiconductor patterns LSP of the first to fourth channel structures VS1 to VS4. The top surface of the dummy lower semiconductor pattern DLSP may also be lower than the top surface of the lowermost electrode EL.

Referring to FIGS. 5C and 5D, each of the dummy channel structures DVS may be provided thereunder with a dummy insulation pattern DIP instead of the dummy impurity layer DIL. Each of the dummy channel structures DVS may include the dummy vertical channel pattern DVC and the second vertical insulation pattern DVP. In this case, as shown in FIG. 5C, the second vertical insulation pattern DVP may be between the dummy insulation pattern DIP and the bottom surface of the dummy vertical channel pattern DVC. In one embodiment, as shown in FIG. 5D, a portion of the dummy vertical channel pattern DVC may penetrate the second vertical insulation pattern DVP to couple with the dummy insulation pattern DIP. In this configuration, even though the dummy vertical channel pattern DVC penetrates the second vertical insulation pattern DVP, the dummy vertical channel pattern DVC may be electrically separated from the substrate 10.

Figure 8:
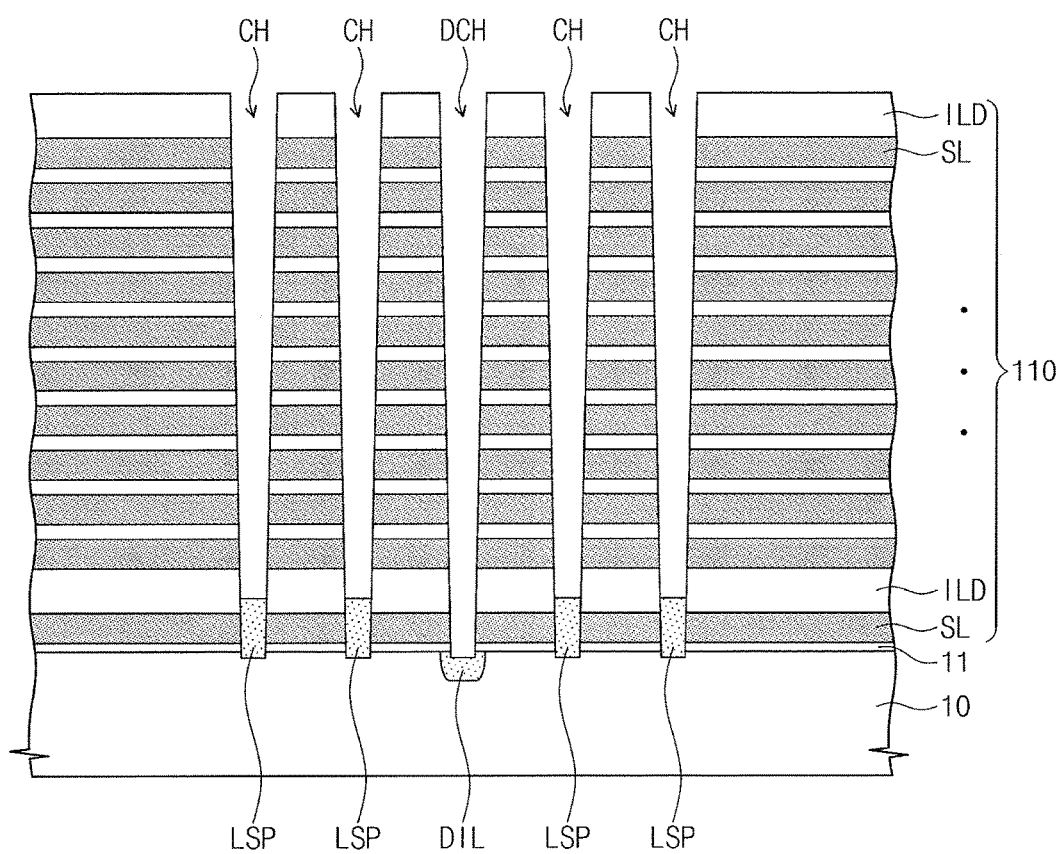
Figure 9:
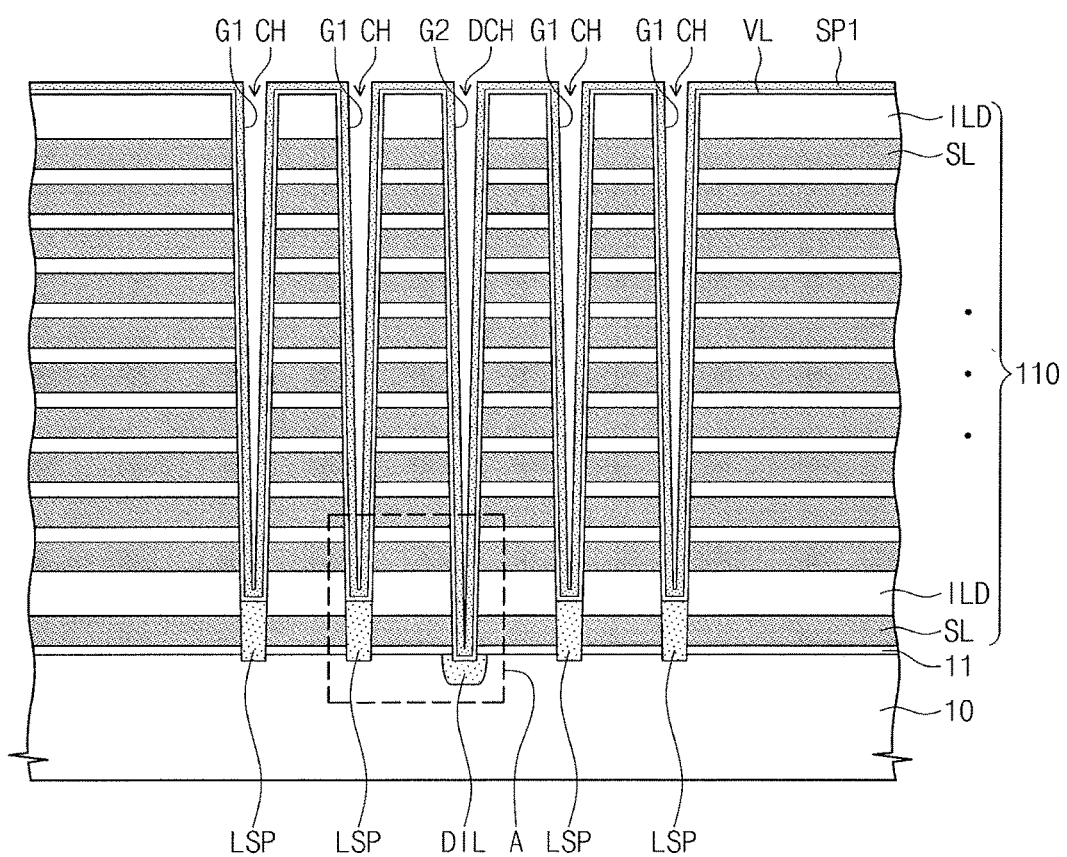
Figure 10:
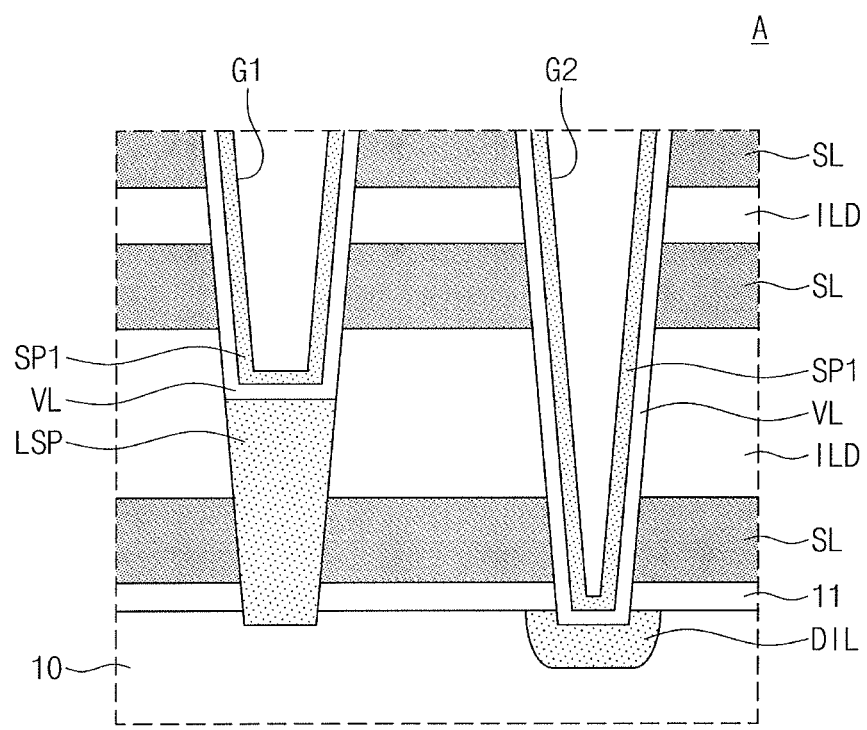
Figure 11:
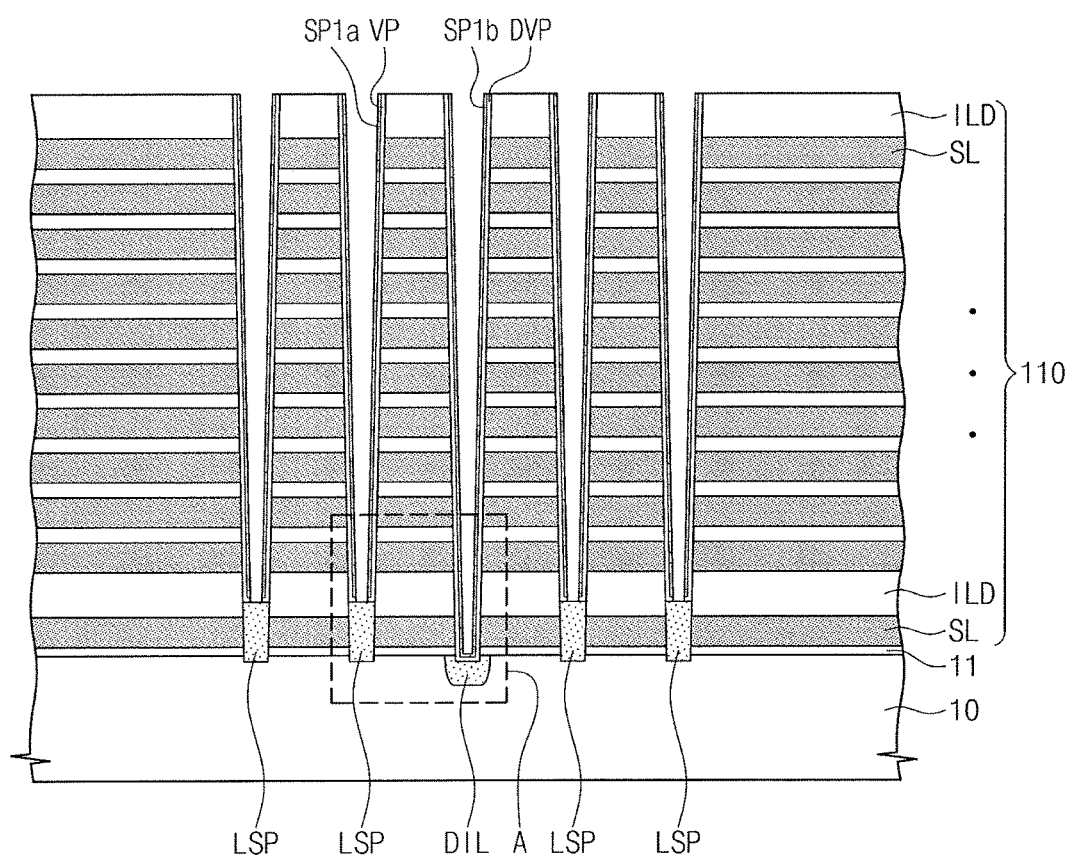
Figure 12:
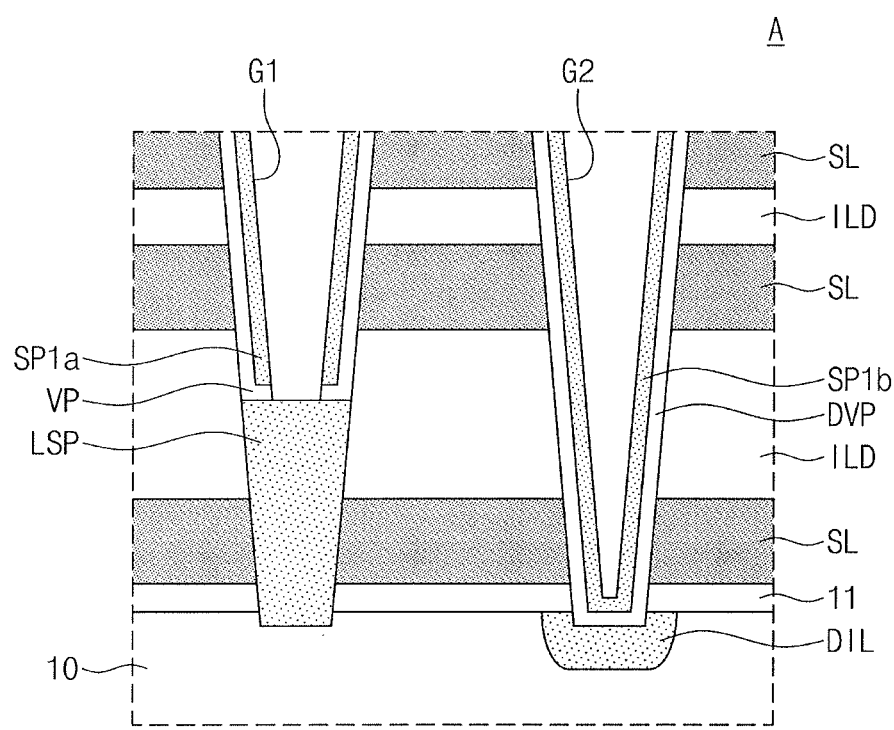
Figure 13:
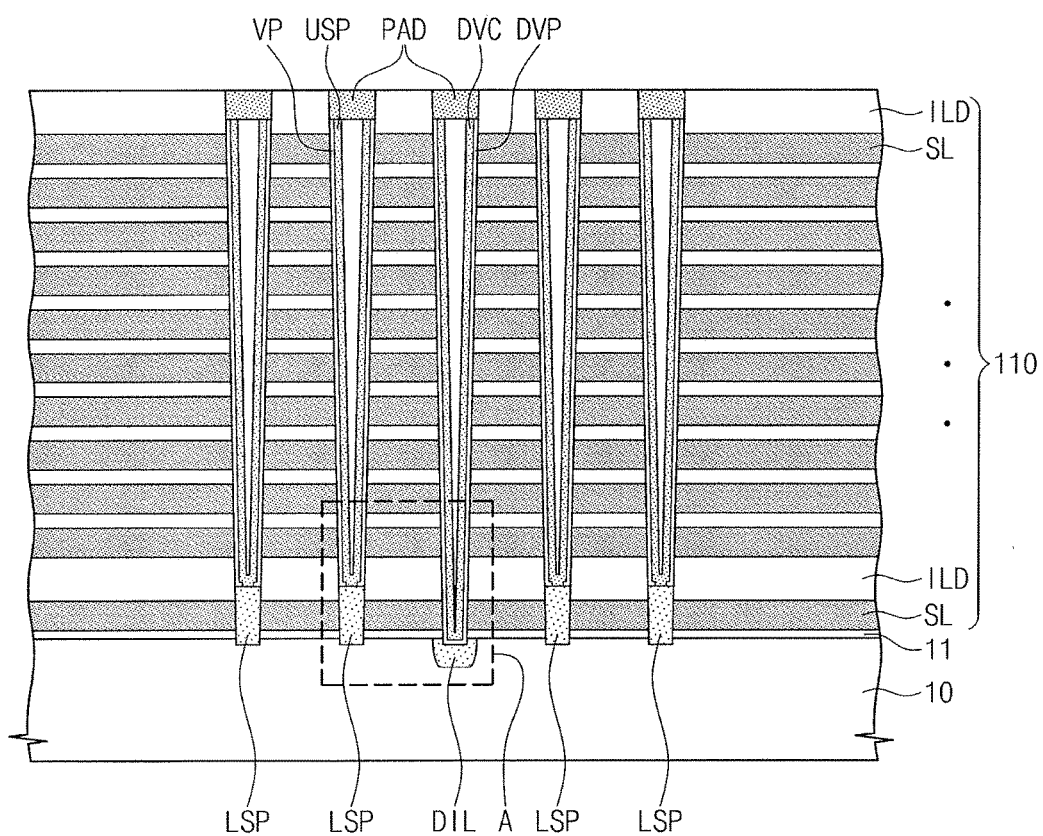
Figure 14:
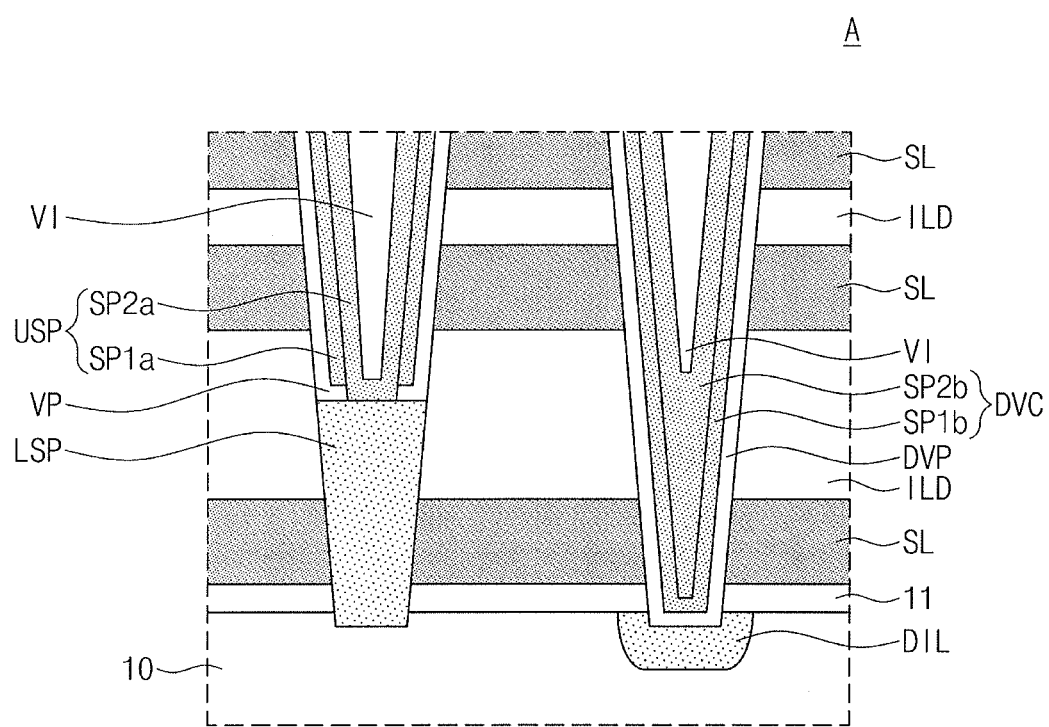

FIGS. 6 to 17 are cross-sectional views corresponding to stages of an embodiment of a method for fabricating a three-dimensional semiconductor memory device. FIGS. 10, 12, and 14 are enlarged view embodiments of section B in FIGS. 9, 11, and 13, respectively.

Figure 6:
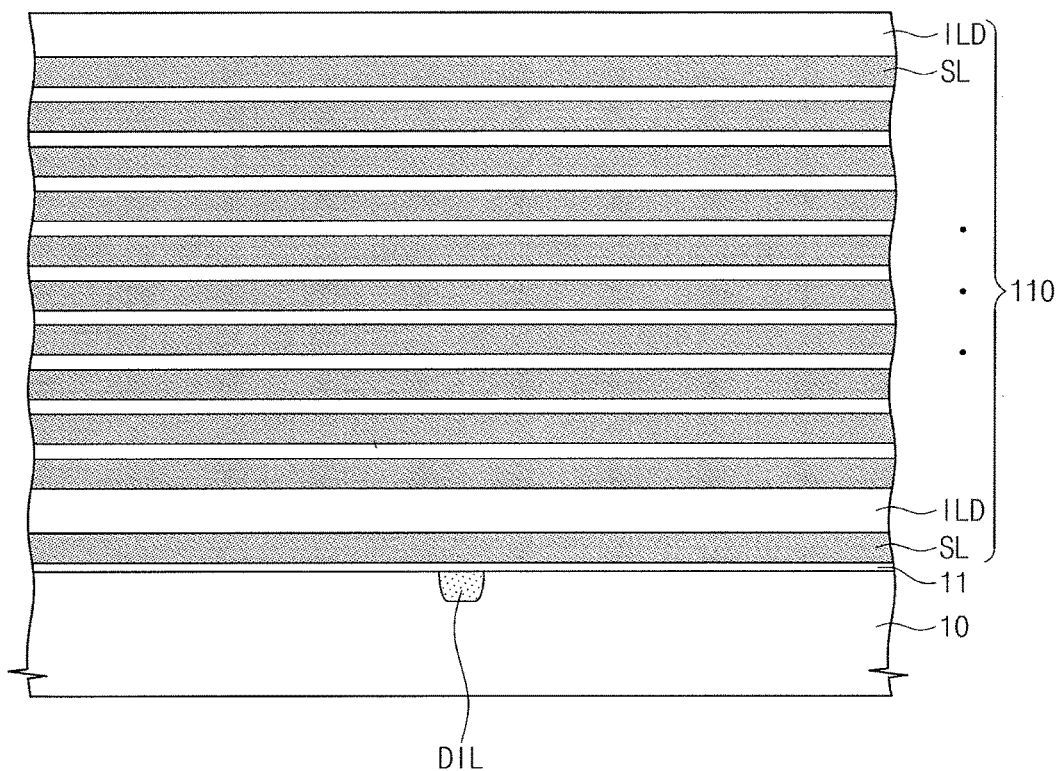
FIGS. 6 to 17 illustrate stages in an embodiment of a method for fabricating a three-dimensional semiconductor memory device, where

Referring to FIGS. 2 and 6, a substrate 10 may include a dummy impurity layer DIL extending in a first direction D1. The dummy impurity layer DIL may be formed, for example, by forming on the substrate 10 a mask pattern having a linear opening extending in a first direction D1 and then implanting impurities into the substrate 10 using the mask pattern as an ion implantation mask. The dummy impurity layer DIL may be formed by doping impurities including, for example, carbon (C), nitrogen (N), or fluorine (F). In an embodiment, the dummy impurity layer DIL may be a carbon layer formed by implanting carbon.

A thin-layer structure 110 may be on the substrate 10 including the dummy impurity layer DIL therein. The thin-layer structure 110 may include sacrificial layers SL and insulation layers ILD that are alternately and repeatedly stacked. The sacrificial layers SL may include a material that can be etched with an etch selectivity to the insulation layers ILD. For example, the sacrificial layers SL and the insulation layers ILD may exhibit a predetermined high etch selectivity to a chemical solution for wet etching and a low etch selectivity to an etch gas for dry etching. In an embodiment, the sacrificial layers SL and the insulation layers ILD may include insulating materials having different etch selectivities from each other. For example, the sacrificial layers SL may be formed of a silicon nitride layer and the insulation layers ILD may be formed of a silicon oxide layer. In some embodiments, the sacrificial layers SL may have substantially the same thickness. In some embodiments, a lowermost one of the sacrificial layers SL may be thicker than others ones of the sacrificial layers SL. The insulation layers ILD may have substantially the same thickness, or one or more of the insulation layers ILD may have a different thickness from other ones of the insulation layers ILD.

Before the thin-layer structure 110 is formed, a buffer insulation layer 11 may be formed to cover a top surface of the substrate 10. The buffer insulation layer 11 may be a silicon oxide layer formed, for example, by deposition or thermal oxidation.

Figure 7:
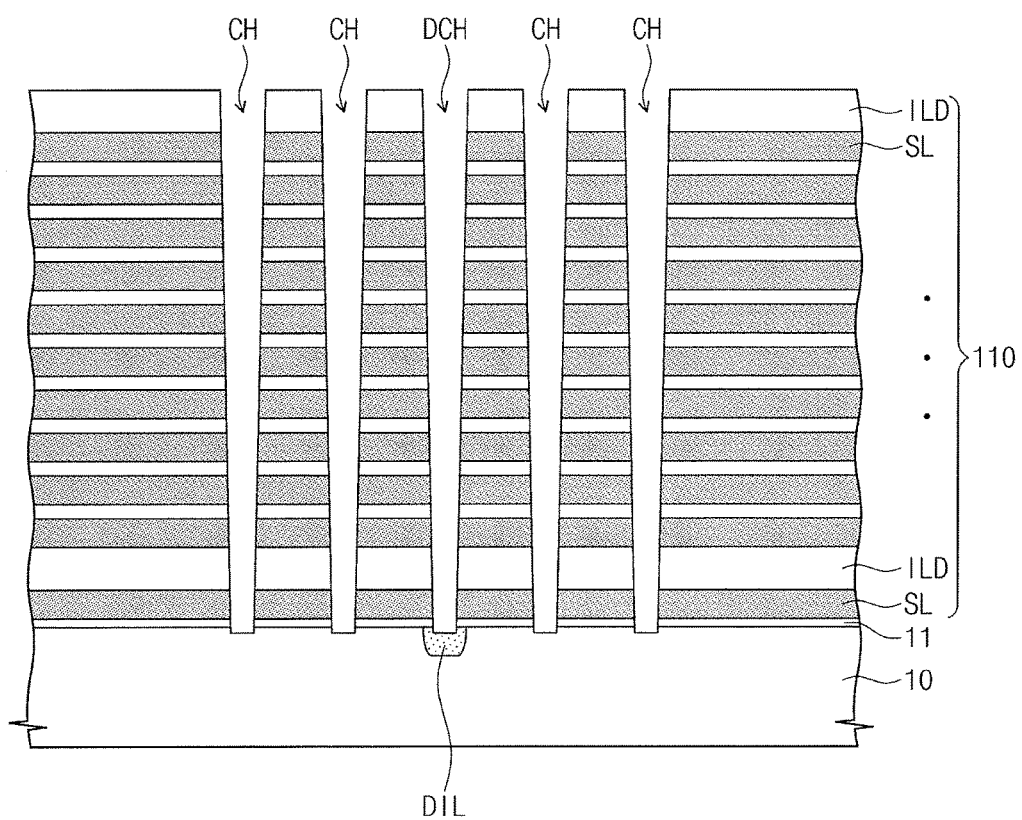

Referring to FIGS. 2 and 7, the thin-layer structure 110 and the buffer insulation layer 11 may be penetrated with channel holes CH exposing the top surface of substrate 10 and with dummy channel holes DCH exposing the dummy impurity layer DIL. In some embodiments, the channel holes CH may correspond to the first to fourth channel structures VS1 to VS4 in FIG. 2. The dummy channel holes DCH may correspond to the dummy channel structures DVS in FIG. 2.

The dummy channel holes DCH may have substantially the same shape and size as the channel holes CH. The channel holes CH and the dummy channel holes DCH may be formed, for example, by forming a mask pattern on the thin-layer structure 110 and performing an anisotropic etching process on the thin-layer structure 110 using the mask pattern as an etch mask. The anisotropic etching process may over-etch the top surface of substrate 10, so that substrate 10 may be recessed on its top surface exposed to channel holes CH and the dummy channel holes DCH. In addition, the anisotropic etching process may cause the lower widths of the channel holes CH and the dummy channel holes DCH to be less than their upper widths and have inclined inner walls.

Referring to FIGS. 2 and 8, lower semiconductor patterns LSP may be formed to fill lower portions of the channel holes CH. The lower semiconductor patterns LSP may be an epitaxial layer formed, for example, by performing a selective epitaxial growth (SEG) process that uses the substrate 10 exposed to the channel holes CH as a seed layer. Accordingly, the lower semiconductor patterns LSP may have a pillar shape that fills lower portions of the channel holes CH. The lower semiconductor pattern LSP may have a top surface higher than a top surface of a lowermost one of the sacrificial layers SL. The lower semiconductor pattern LSP may have an inclined top surface relative to the top surface of the substrate 10. The lower semiconductor pattern LSP may have, for example, a non-planar top surface.

The lower semiconductor patterns LSP may include single crystalline silicon, polycrystalline silicon, polycrystalline germanium, and/or single crystalline germanium. In one embodiment, the lower semiconductor patterns LSP may include carbon nanostructure, organic semiconductor material, and/or compound semiconductor. The lower semiconductor pattern LSP may have the same conductivity as the substrate 10. In one embodiment, the lower semiconductor pattern LSP may be in-situ doped with impurities in the selective epitaxial growth process. In one embodiment, after the lower semiconductor pattern LSP is formed, the lower semiconductor pattern LSP may be doped with impurities.

The channel holes CH and the dummy channel holes DCH may be supplied with a source gas and a carrier gas in the selective epitaxial growth process. The source gas may be, for example, a silicon source gas such as monochlorosilane ($SiH_3Cl$), DCS (dichlorosilane), TCS (trichlorosilane), HCS (hexachlorosilane), $SiH_4$, and $Si_2H_6$. The carrier gas may be, for example, one or more of hydrogen gas, helium gas, nitrogen gas, or argon gas.

The source gas may be supplied through the channel holes CH into the substrate 10 (e.g., silicon wafer), and the substrate 10 exposed to the channel holes CH may be used as a seed, which may grow the lower semiconductor patterns LSP from floor surfaces of the channel holes CH. However, when the selective epitaxial growth process is performed, epitaxial growth may be inhibited by impurities (e.g., carbon) in the dummy impurity layers DIL exposed to the dummy channel holes DCH. An epitaxial growth rate may therefore be less in the dummy channel holes DCH than in the channel holes CH. For example, the amount of silicon seed may be less in the dummy channel holes DCH than in the channel holes CH. This may produce a difference in the growth rate between in the dummy channel holes DCH and in the channel holes CH.

Accordingly, as illustrated in FIG. 5A, no lower semiconductor patterns LSP may be grown in the dummy channel holes DCH while the lower semiconductor patterns LSP are formed in the channel holes CH, or as illustrated in FIG. 5B, the dummy vertical channel pattern DVC may be formed to have a second height less than a first height of the lower semiconductor pattern LSP.

Referring to FIGS. 2, 9, and 10, a vertical insulation layer VL and a first semiconductor layer SP1 may be sequentially formed in the dummy channel holes DCH and the channel holes CH in which the lower semiconductor patterns LSP are formed. A chemical vapor deposition (CVD) or atomic layer deposition (ALD) may be employed to form the vertical insulation layer VL to have uniform thickness on inner walls of the channel holes CH and the dummy channel holes DCH. The vertical insulation layer VL may be a single layer or a plurality of layers with predetermined thinness. In some embodiments, the vertical insulation layer VL may include a tunnel insulation layer, a charge storage layer, and a blocking insulation layer that constitute a data storage layer of a vertical NAND Flash memory device.

In some embodiments, the vertical insulation layer VL may have a bottom surface whose level in the channel holes CH is different from that in the dummy channel holes DCH. For example, the bottom surface of the vertical insulation layer VL may be lower in the dummy channel holes DCH than in the channel holes CH. Because the channel holes CH and the dummy channel holes DCH have inclined sidewalls, the width of the bottom surface of the vertical insulation layer VL may be greater in the channel holes CH than in the dummy channel holes DCH.

A chemical vapor deposition (CVD) or atomic layer deposition (ALD) may be used to form the first semiconductor layer SP1 with a uniform thickness on the vertical insulation layer VL. The first semiconductor layer SP1 may include silicon (Si), germanium (Ge), or a mixture thereof. The first semiconductor layer SP1 may be a semiconductor doped with impurities or an intrinsic semiconductor with no doped impurities. The first semiconductor layer SP1 may have a crystal structure including a single crystalline structure, an amorphous structure, or a polycrystalline structure.

In an embodiment, the sum of thicknesses of the vertical insulation layer VL and the first semiconductor layer SP1 may be less than about half the upper width of each of the channel holes CH and the dummy channel holes DCH. Accordingly, the vertical insulation layer VL and the first semiconductor layer SP1 may define gaps G1 and G2 having a high aspect ratio in the channel holes CH and the dummy channel holes DCH. For example, first gaps G1 may be defined in the channel holes CH and second gaps G2 may be defined in the dummy channel holes DCH. The second gap G2 may have an aspect ratio greater than that of the first gap G1.

Referring to FIGS. 2, 11, and 12, a first vertical insulation pattern VP and a first semiconductor pattern SP1a may be formed in each of the channel holes CH, and a second vertical insulation pattern DVP and a first dummy semiconductor pattern SP1b may be formed in each of the dummy channel holes DCH.

An overall anisotropic etching process may be performed on the vertical insulation layer (e.g., VL of FIG. 9) and the first semiconductor layer (e.g., SP1 of FIG. 9) to form the first vertical insulation pattern VP, the first semiconductor pattern SP1a, the second vertical insulation pattern DVP, and the first dummy semiconductor pattern SP1b. The anisotropic etching process may etch the vertical insulation layer VL and the first semiconductor layer SP1 on a floor surface of the first gap G in order to reveal the lower semiconductor pattern LSP. The anisotropic etching process may also etch the vertical insulation layer VL and the first semiconductor layer SP1 on a top surface of the thin-layer structure 110. Therefore, the first vertical insulation pattern VP and the first semiconductor pattern SP1a may have a pipe shape with open opposite ends.

As the vertical insulation layer VL has the bottom surface with a level in the channel holes CH different from that in the dummy channel holes DCH, e.g., the second gap G2 may have a greater aspect ratio than that of the first gap G1. The anisotropic etching process may be performed less effectively in the second gap G2 than in the first gap G1. Accordingly, the vertical insulation layer VL and the first semiconductor layer SP1 may remain without being etched in the second gap G2, while the lower semiconductor pattern LSP is exposed to the first gap G1. Therefore, the second vertical insulation pattern DVP and the first dummy semiconductor pattern SP1b may have a pipe shape or a "U" shape having a closed bottom end. The dummy impurity layer DIL may not be exposed to the second gap G2.

Referring to FIGS. 2, 13, and 14, a second semiconductor pattern SP2a may be formed on the first semiconductor pattern SP1a, and a second dummy semiconductor pattern SP2b may be formed on the first dummy semiconductor pattern SP1b. As such, an upper semiconductor pattern USP may be formed on the lower semiconductor pattern LSP, and a dummy vertical channel pattern DVC may be formed on the second vertical insulation pattern DVP.

The second semiconductor pattern SP2a and the second dummy semiconductor pattern SP2b may be a polycrystalline silicon layer formed by atomic layer deposition (ALD) or chemical vapor deposition (CVD) techniques. The second semiconductor pattern SP2a and the second dummy semiconductor pattern SP2b may be conformally formed to a thickness sufficient to not completely fill the first and second gaps G1 and G2. A filling insulation layer VI may be formed to partially or completely fill each of the first and second gaps G1 and G2 in which the second semiconductor pattern SP2a and the second dummy semiconductor pattern SP2b are respectively formed. In one embodiment, no filling insulation layer VI may be formed. When no filling insulation layer VI is formed or the filling insulation layer VI partially fills each of the first and second gaps G1 and G2, the channel holes CH and the dummy channel holes DCH may include therein a hollow space or an air gap.

Conductive pads PAD may be formed at top ends of the first and second semiconductor patterns SP1a and SP2a and at top ends of the first and second dummy semiconductor patterns SP1b and SP2b. The conductive pads PAD may be an impurity doped region or may include a conductive material.

Separation insulation patterns (e.g., see 35 of FIG. 4) may be formed to horizontally divide uppermost sacrificial layers SL. The separation insulation pattern 35 may be formed between the dummy vertical channel patterns DVC adjacent to each other in the first direction D1.

Figure 15:
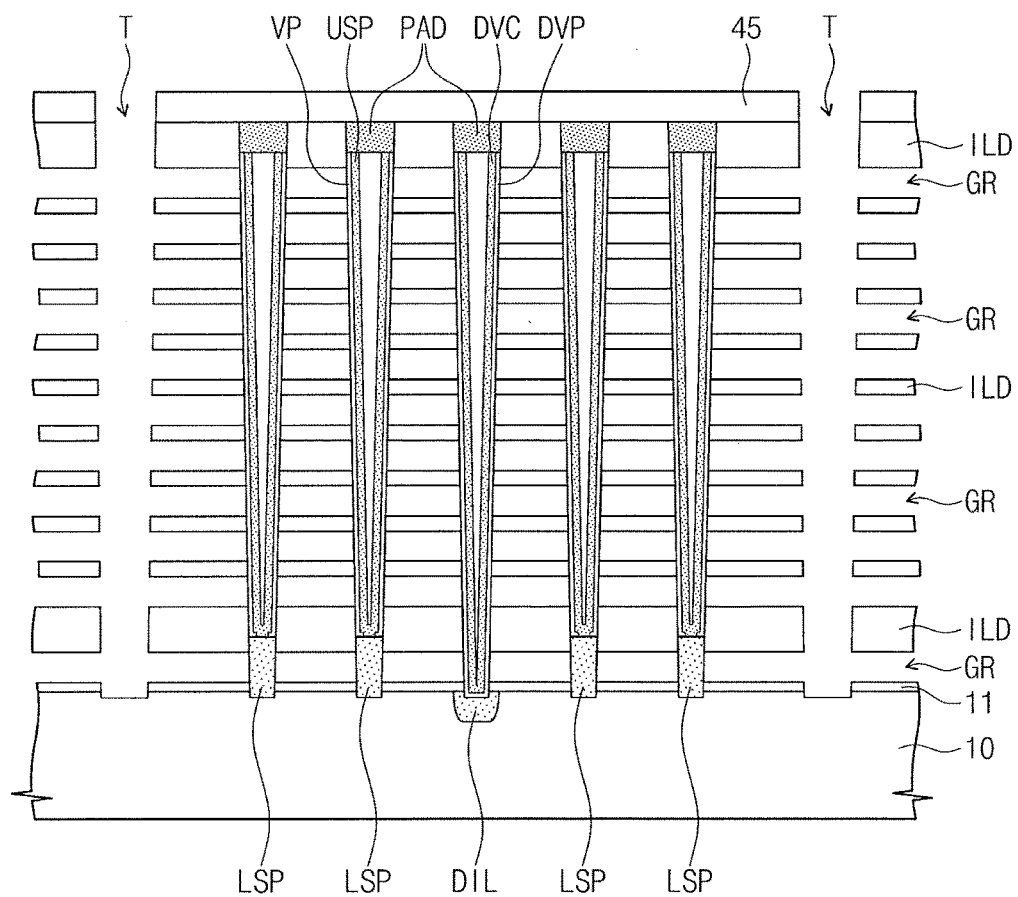

Referring to FIGS. 2 and 15, the thin-layer structure 110 may be patterned to form trenches T through which the substrate 10 is exposed. The trenches T may extend in the first direction D1 and may be spaced apart from each other in a second direction D2. Each trench T may be spaced apart from the dummy impurity layer DIL in the second direction D2.

Formation of the trenches T may include forming a capping insulation layer to cover top surfaces of the upper semiconductor patterns USP and the dummy vertical channel patterns DVC, forming on the capping insulation layer a mask pattern defining planar positions of the trenches T, and anisotropically etching the thin-layer structure 110 using the mask pattern as an etch mask. As the trenches T are formed, the capping insulation layer may be transformed into a capping insulation pattern 45 on the thin-layer structure 110, and the sacrificial layers SL and the insulation layers ILD may be exposed on their sidewalls.

Processes may be performed to substitute electrodes EL for the sacrificial layers SL exposed to the trenches T. For example, gate regions GR may be formed by removing the sacrificial layers SL exposed to the trenches T. The gate regions GR may be formed by isotropically etching the sacrificial layers SL using an etch recipe having an etch selectivity to the insulation layers ILD. For example, when the sacrificial layers SL are a silicon nitride layer and the insulation layers ILD are a silicon oxide layer, an etchant including phosphoric acid may be used to isotropically etch the sacrificial layers SL to form the gate regions GR. The gate regions GR may horizontally extend from the trenches T to expose portions of the first and second vertical insulation patterns VP and DVP. A lowermost one of the gate regions GR may expose a portion of the lower semiconductor pattern LSP.

Figure 16:
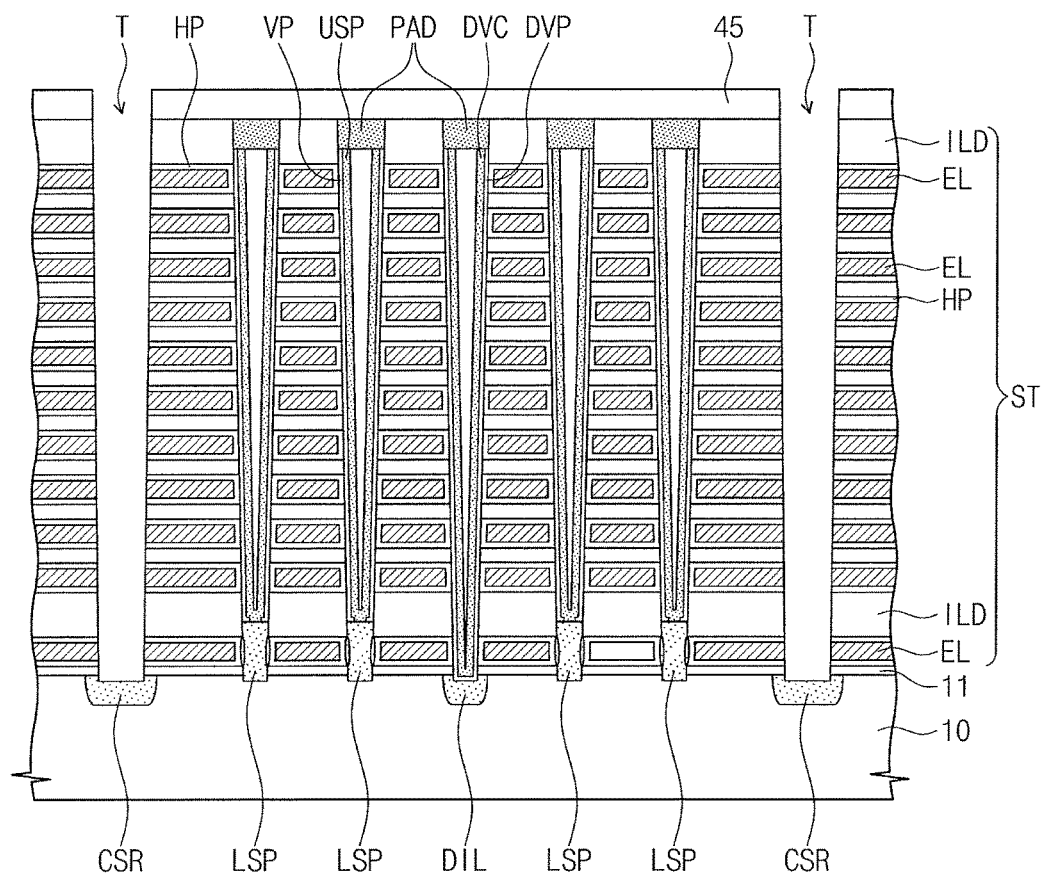

Referring to FIGS. 2 and 16, horizontal insulation patterns HP and electrodes EL may be formed in the gate regions GR. Formation of the horizontal insulation patterns HP and the electrodes EL may include forming a horizontal insulation layer to conformally cover the gate regions GR, forming on the horizontal layer a gate conductive layer to fill the gate regions GR, and removing the gate conductive layer from the trenches T to form the electrodes EL that are vertically separated from each other. In addition, before the horizontal insulation pattern HP is formed, a thermal oxide layer 13 may be formed on a sidewall of the lower semiconductor pattern LSP exposed to the lowermost gate region GR. The horizontal insulation pattern HP may be a portion of a data storage layer in a NAND Flash memory transistor. Each of the electrodes EL may include a barrier metal layer and a metal layer that are sequentially deposited. The barrier metal layer may include a metal nitride layer, e.g., TiN, TaN, or WN. The metal layer may include a metallic material, e.g., W, Al, Ti, Ta, Co, or Cu.

The gate conductive layer may be formed using, for example, chemical vapor deposition or atomic layer deposition. The gate conductive layer may therefore be formed on sidewalls of the trenches T and a top surface of the capping insulation pattern 45 while filling the gate regions GR. When the gate conductive layer is deposited to fill the gate regions GR, a source gas may be horizontally supplied from the trenches T into the gate regions GR. A seam or void may be formed in the gate conductive layer deposited in the gate regions GR. The seam or void may be adjacent to the dummy channel structures DVS which are, for example, located farthest away from the trench T. As the electrodes EL are formed as discussed above, electrode structures ST may be formed to include the insulation layers ILD and the electrodes EL that are alternately stacked on the substrate 10.

After the electrode structures ST are formed, common source regions CSR may be formed in the substrate 10 exposed to the trenches T. The common source regions CSL may extend in parallel in the first direction D1 and be spaced apart from each other in the second direction D2. The common source regions CSR may be formed by doping the substrate 10 with impurities having a conductivity different from the substrate 10. In addition, impurities doped in the common source regions CSR may be different from those of the dummy impurity layer DIL. The common source regions CSR may include, for example, N-type impurities (e.g., arsenic (As) or phosphor (P)).

Figure 17:
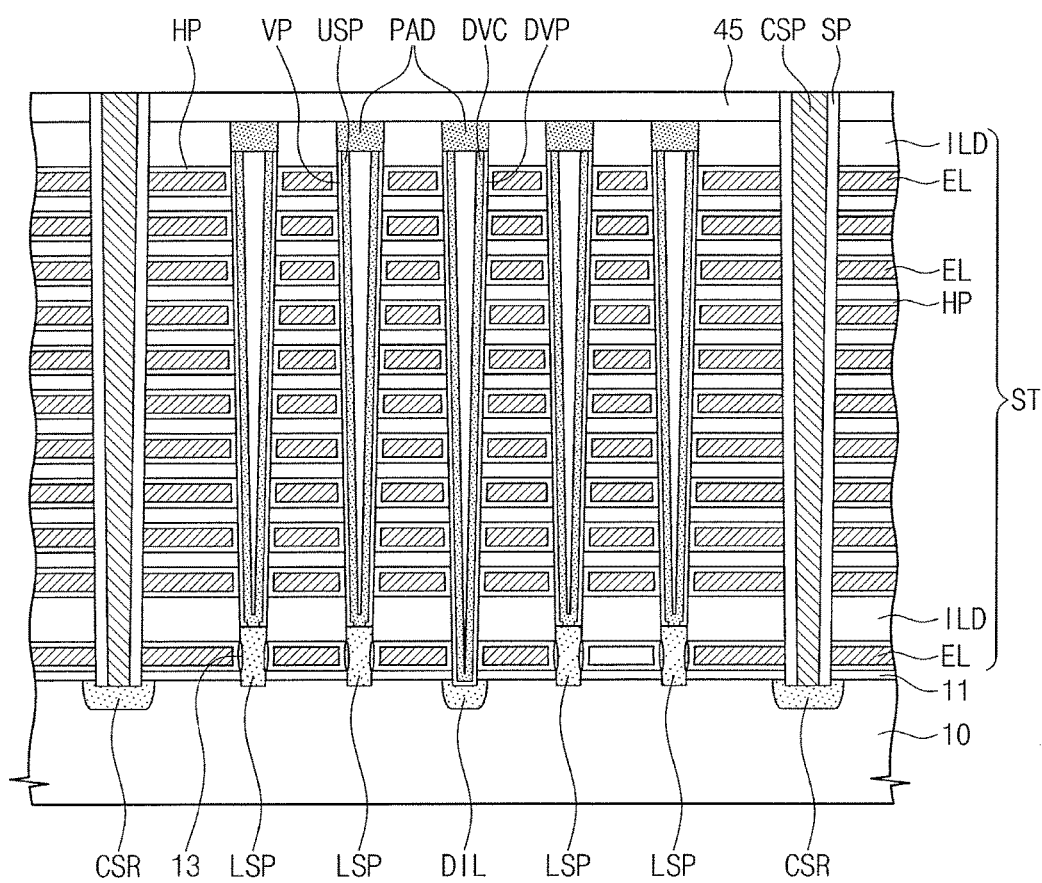

Referring to FIGS. 2 and 17, after the electrode structures ST are formed, insulation spacers SP and common source plugs CSP may be formed in the trenches T. For example, formation of the insulation spacers SP may include depositing a spacer layer to have a uniform thickness on the substrate 10 on which the electrode structures ST are formed, and performing an etch-back process on the spacer layer to expose the common source region CSR. The insulation spacer SP may have a thickness that decreases in a direction from a lower portion of the electrode structure ST to an upper portion of the electrode structure ST.

A conductive layer may be deposited to fill the trenches T in which the insulation spacers SP are formed. The conductive layer may be planarized until the top surface of the capping insulation pattern 45 is exposed, thereby forming source plugs CSP. Thereafter, as illustrated in FIGS. 2, 3, and 4, subsidiary lines SBL1 to SBL4 may be formed and first and second bit lines BL and BL2 may be formed.

Figure 18:
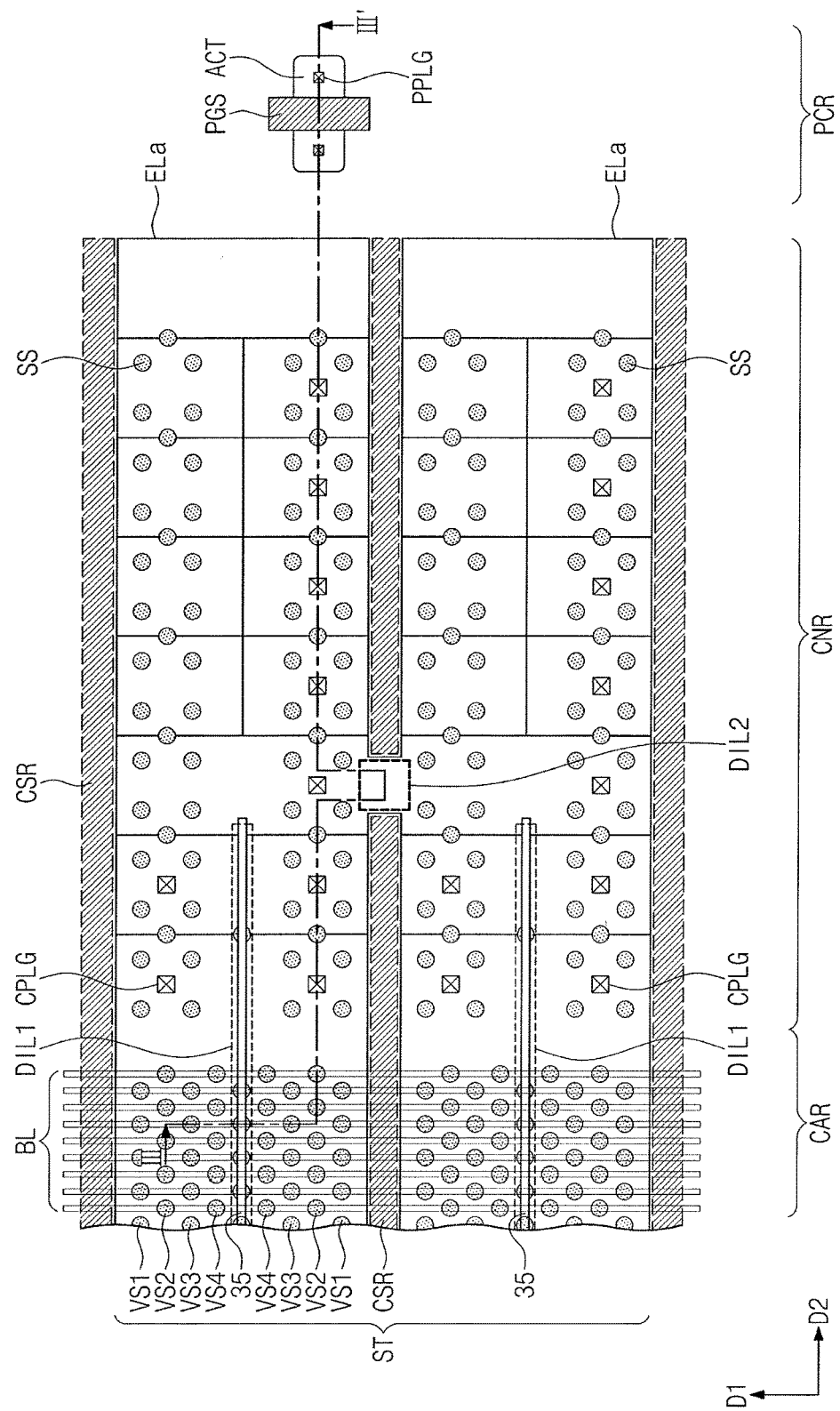
FIG. 18 illustrates another embodiment of a three-dimensional semiconductor memory device.
Figure 19:
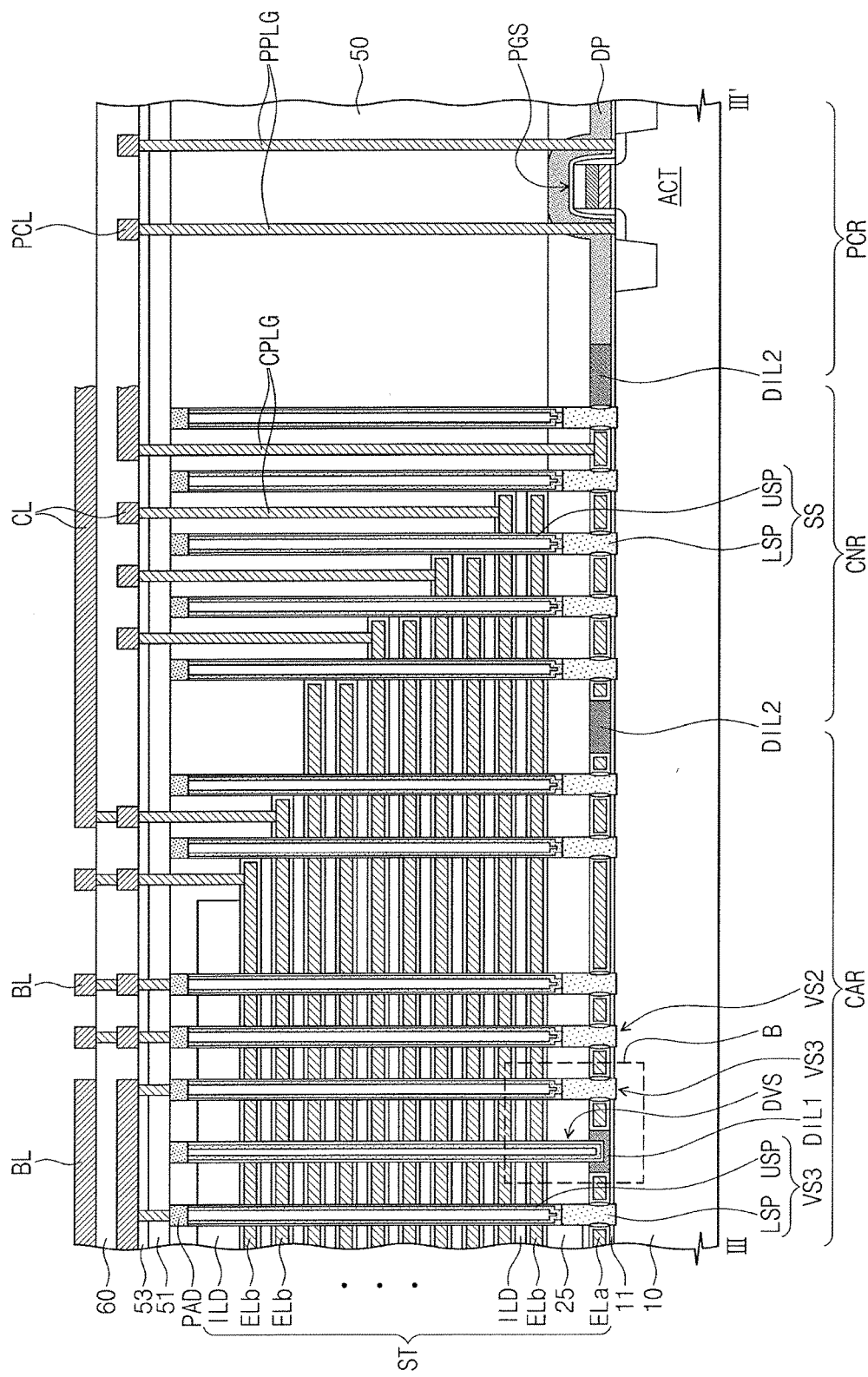
FIGS. 19, 21, and 23 illustrate views along section line III-III' in FIG. 18.
Figure 20:
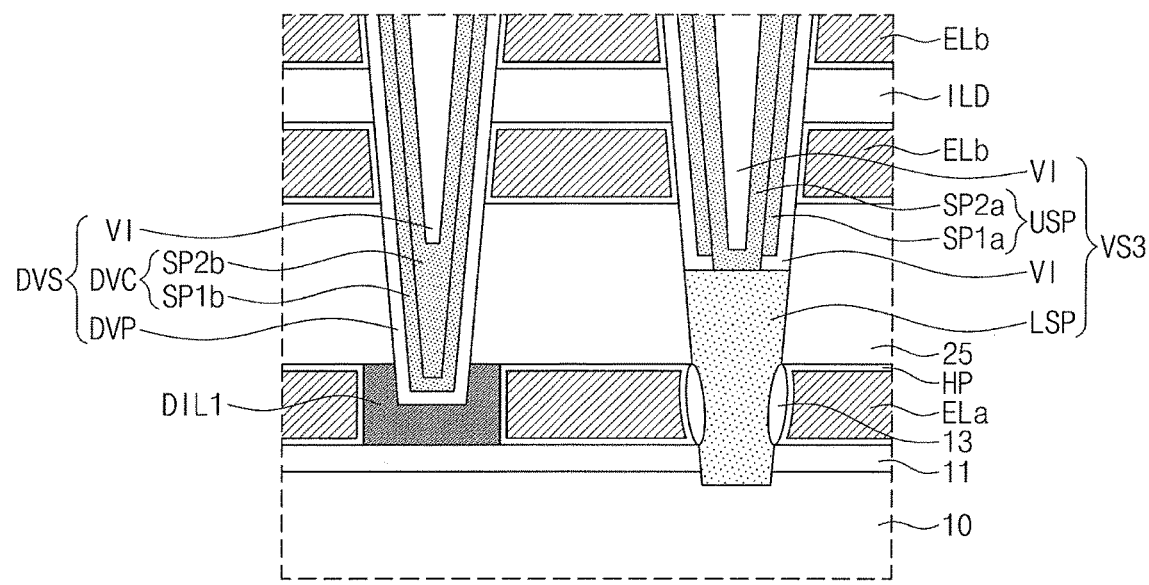
FIGS. 20, 22, and 24 illustrate embodiments of section B in FIGS. 19, 21, and 23, respectively.
Figure 21:
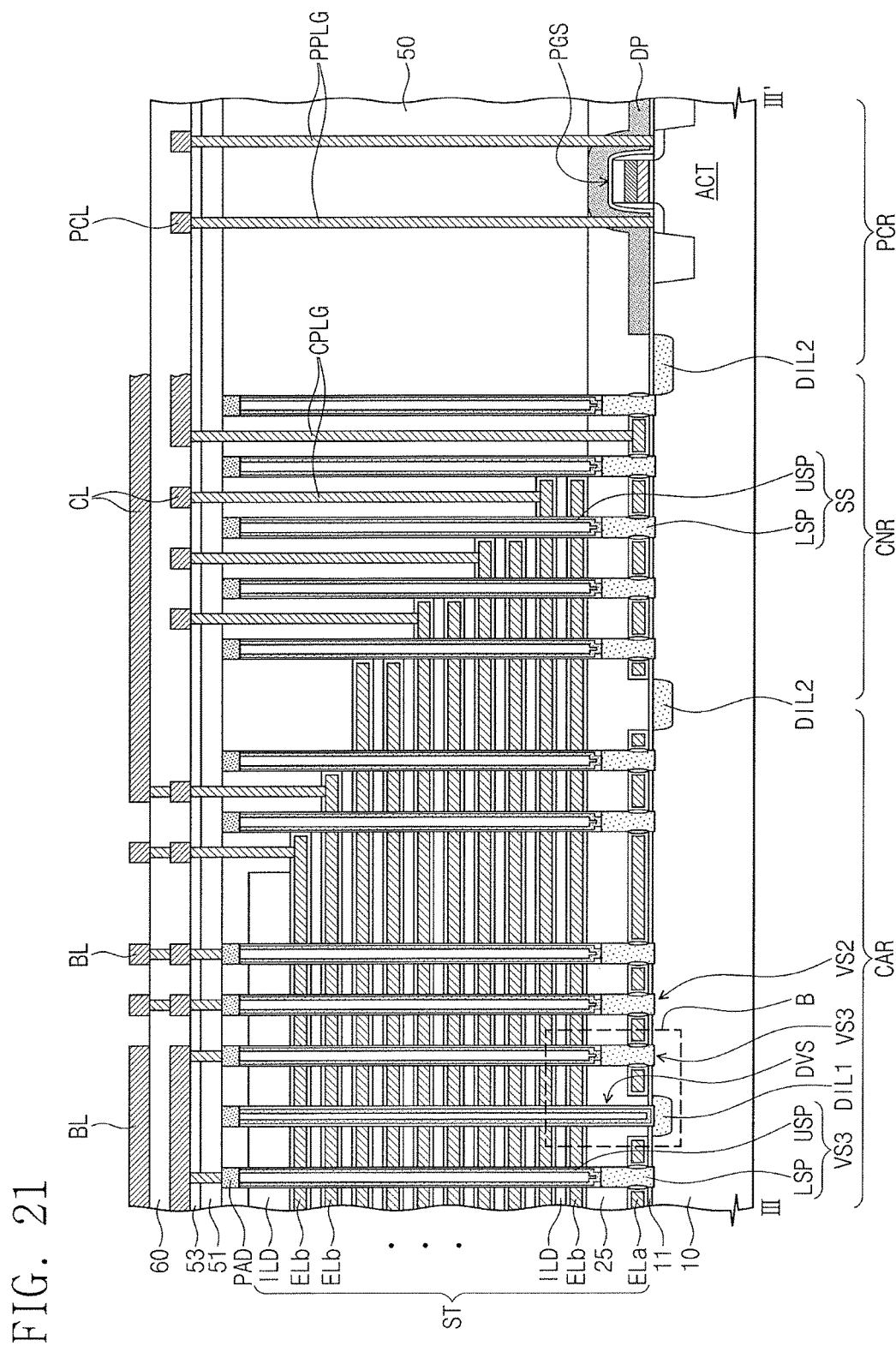
Figure 22:
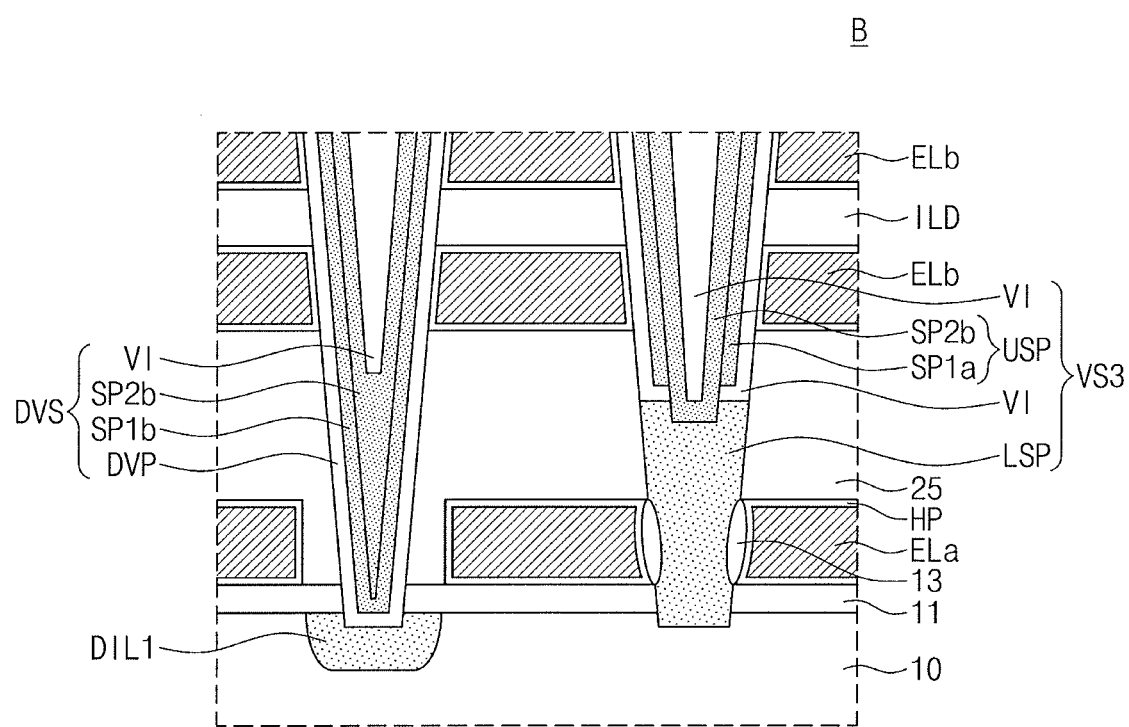
Figure 23:
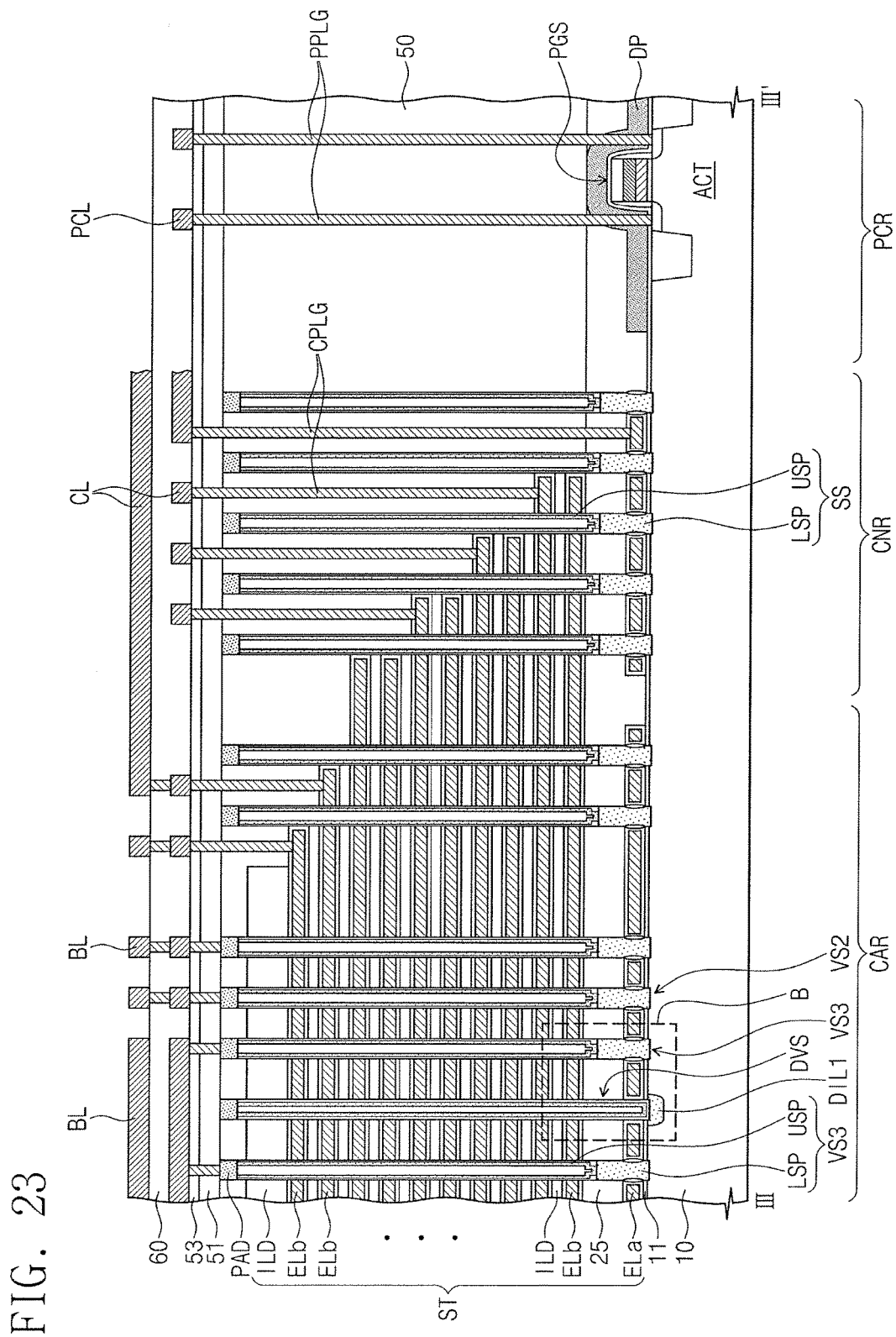
Figure 24:
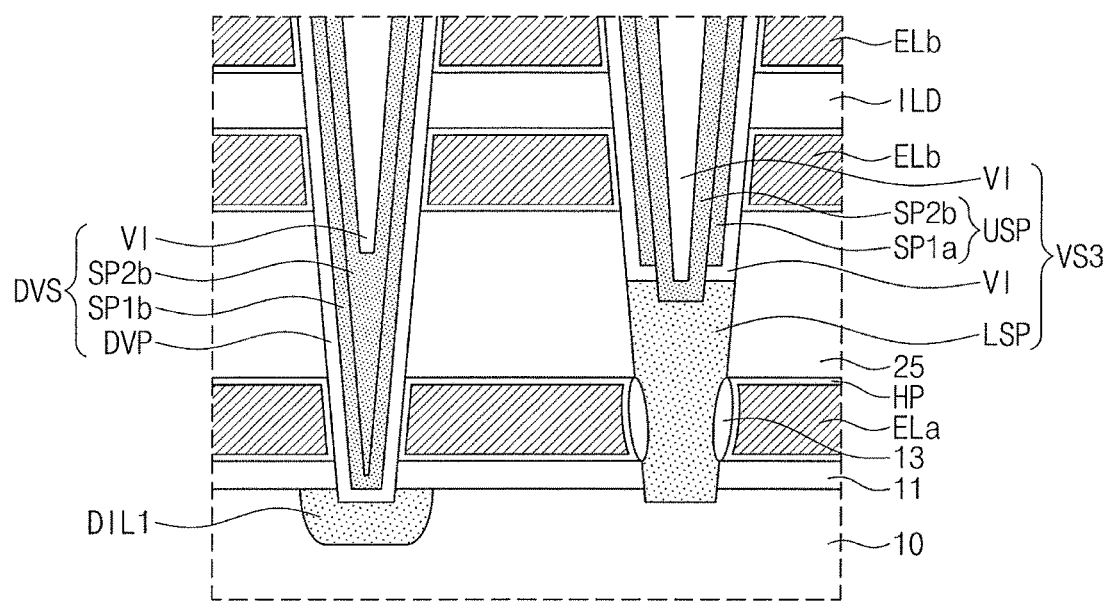

FIG. 18 is a plan view illustrating another embodiment of a three-dimensional semiconductor memory device. FIGS. 19, 21, and 23 are cross-sectional views taken along line III-III' in FIG. 18 illustrating a three-dimensional semiconductor memory device according to exemplary embodiments. FIGS. 20, 22, and 24 are enlarged view embodiments of section B in FIGS. 19, 21, and 23, respectively.

Referring to FIGS. 18, 19, and 20, a substrate 10 may include a cell array region CAR, a connection region CNR, and a peripheral circuit region PCR. The connection region CNR may be between the cell array region CAR and the peripheral circuit region PCR. Peripheral logic circuits may be on the substrate 10 of the peripheral circuit region PCR. Peripheral gate stacks PGS may run across an active area ACT of the peripheral circuit region PCR. Each of the peripheral gate stacks PGS may include a gate dielectric layer, a polysilicon layer, a metal layer, and a hardmask layer that are sequentially stacked on the substrate 10. In addition, spacers may cover opposite sidewalls of each of the peripheral gate stacks PGS, and source/drain regions may be in the active area ACT on opposite sides of each of the peripheral gate stacks PGS.

A dummy sacrificial pattern DP may conformally cover the peripheral gate stacks PGS on the peripheral circuit region PCR. The dummy sacrificial pattern DP may be a portion of a lowermost sacrificial layer SL in the thin-layer structure 110, for example, as discussed with reference to FIG. 6.

An electrode structure ST may be on the substrate 10 and extend from the cell array region CAR toward the connection region CNR along a first direction D1. In an embodiment, the electrode structure ST may include lower electrodes ELa horizontally spaced apart from each other, a lower planarized insulation layer 25 on the lower electrodes ELa, and insulation layers ILD and upper electrodes ELb that are alternately and vertically stacked on the lower planarized insulation layer 25. Each of the lower electrodes ELa may have, for example, a linear shape extending from the cell array region CAR toward the connection region CNR. An uppermost one of the upper electrodes ELb may also have a linear shape.

The electrode structure ST may have a stepwise structure on the connection region CNR. The lower planarized insulation layer 25 may be thicker than the insulation layers ILD between the upper electrodes ELb and may continuously extend toward the peripheral circuit region PCR to cover a portion of the dummy sacrificial pattern DP.

Common source regions CSR may extend from the cell array region CAR toward the connection region CNR along the first direction D1 and may be spaced apart from each other in a second direction D2. One of the common source regions CSR may be in the substrate 10 between the lower electrodes ELa.

In some embodiments, first dummy impurity layers DIL1 may be between the common source regions CSR adjacent to each other and may penetrate corresponding lower electrodes ELa. The first dummy impurity layer DIL1 may extend in parallel to the common source regions CSR in the first direction D1. For example, on the substrate 10, the first dummy impurity layer DIL1 may extend toward the connection region CNR from the substrate 10 of the cell array region CAR. The length of the first dummy impurity layer DIL1 may be less than the lower electrodes ELa, in the first direction D1. On the connection region CNR, a second impurity layer DIL2 may be between the lower electrodes ELa and adjacent to the common source regions CSR. In addition, on the peripheral circuit region PCR, the second dummy impurity layer DIL2 may fill an area between the lower electrodes ELa and the dummy sacrificial pattern DP. The first and second dummy impurity layers DIL1 and DIL2 may be, for example, a carbon-doped polycrystalline silicon layer or silicon germanium layer.

First to fourth channel structures VS1 to VS4 and dummy channel structures DVS may penetrate the electrode structure ST. The first to fourth channel structures VS1 to VS4 may be on the substrate 10 of the cell array region CAR and the dummy channel structures DVS may be on the first dummy impurity layer DIL1 of the cell array region CAR. In addition, support structures SS may penetrate the electrode structure ST on the connection region CNR. The support structures SS may have substantially the same structures as the first to fourth channel structures VS1 to VS4.

In an embodiment, as illustrated in FIG. 20, as the first dummy impurity layers DIL1 penetrate corresponding lower electrodes ELa on the substrate 10 of the cell array region CAR, each of the dummy channel structures DVS may have a bottom surface higher than a bottom surface of each of the first to fourth channel structures VS1 to VS4. As discussed above each of the dummy channel structures DVS may include a second vertical insulation pattern DVP that extends between a bottom surface of a dummy vertical channel pattern DVC and a top surface of the first impurity layer DIL1 from a sidewall of the dummy vertical channel pattern DVC.

The lower planarized insulation layer 25 may be provided thereon with an upper planarized insulation layer 50 that covers an entire surface of the substrate 10 and has substantially planar top surface. The upper planarized insulation layer 50 may cover ends of the upper electrodes ELb. Cell contact plugs CPLG may penetrate the upper planarized insulation layer 50 and first and second interlayer dielectric layers 51 and 53 to couple with corresponding ends of the upper electrodes ELb. An end of the lower electrode ELa may be coupled to one of the cell contact plugs CPLG that penetrates the second interlayer dielectric layer 53, the first interlayer dielectric layer 51, the upper planarized insulation layer 50, and the lower planarized insulation layer 25. Peripheral contact plugs PPLG may penetrate the first and second interlayer dielectric layers 51 and 53, the upper planarized insulation layer 50, and the dummy sacrificial pattern DP to couple with the source/drain regions of the peripheral gate stacks PGS. The second interlayer dielectric layer 53 may be provided thereon with subsidiary lines of the cell array region CAR, connection lines CL of the connection region CNR, and peripheral circuit lines PCL of the peripheral circuit region PCR. Bit lines BL may extend in the second direction D2 on a third interlayer dielectric layer 60 and be coupled to the subsidiary lines through contact plugs.

Referring to FIGS. 21 and 22, each of the lower electrodes ELa may have a predetermined (e.g., linear) shape extending from the cell array region CAR toward the connection region CNR. Each of the lower electrodes ELa may have, for example, a linear opening. The first dummy impurity layer DIL1 may be in the substrate 10 exposed through the openings of the lower electrodes ELa. The lower planarized insulation layer 25 may fill the openings of the lower electrodes Ela and may cover the first dummy impurity layer DIL1. The dummy channel structures DVS may penetrate the upper electrodes ELb of the electrode structure ST to couple with the first dummy impurity layer DIL1, while being spaced apart from the lower electrodes ELa. In an embodiment, a portion of the lower planarized insulation layer 25 may fill an area between the lower electrodes ELa on the connection region CNR.

Referring to FIGS. 23 and 24, each of the lower electrodes ELa may have a predetermined (e.g., linear) shape extending from the cell array region CAR toward the connection region CNR. Each of the lower electrodes ELa may cover the first dummy impurity layer DIL1. The dummy channel structures DVS may penetrate corresponding lower electrodes ELa to couple with the first dummy impurity layer DIL1.

FIGS. 25A to 29A are plan views of stages of another embodiment of a method for fabricating a three-dimensional semiconductor memory device. FIGS. 25B to 29B illustrate cross-sectional views taken along line IV-IV' in FIGS. 25A to 29A, respectively, illustrating another embodiment of a method for fabricating a three-dimensional semiconductor memory device. FIG. 30 illustrates an enlarged view embodiment of section C in FIG. 29B.

Figure 25A:
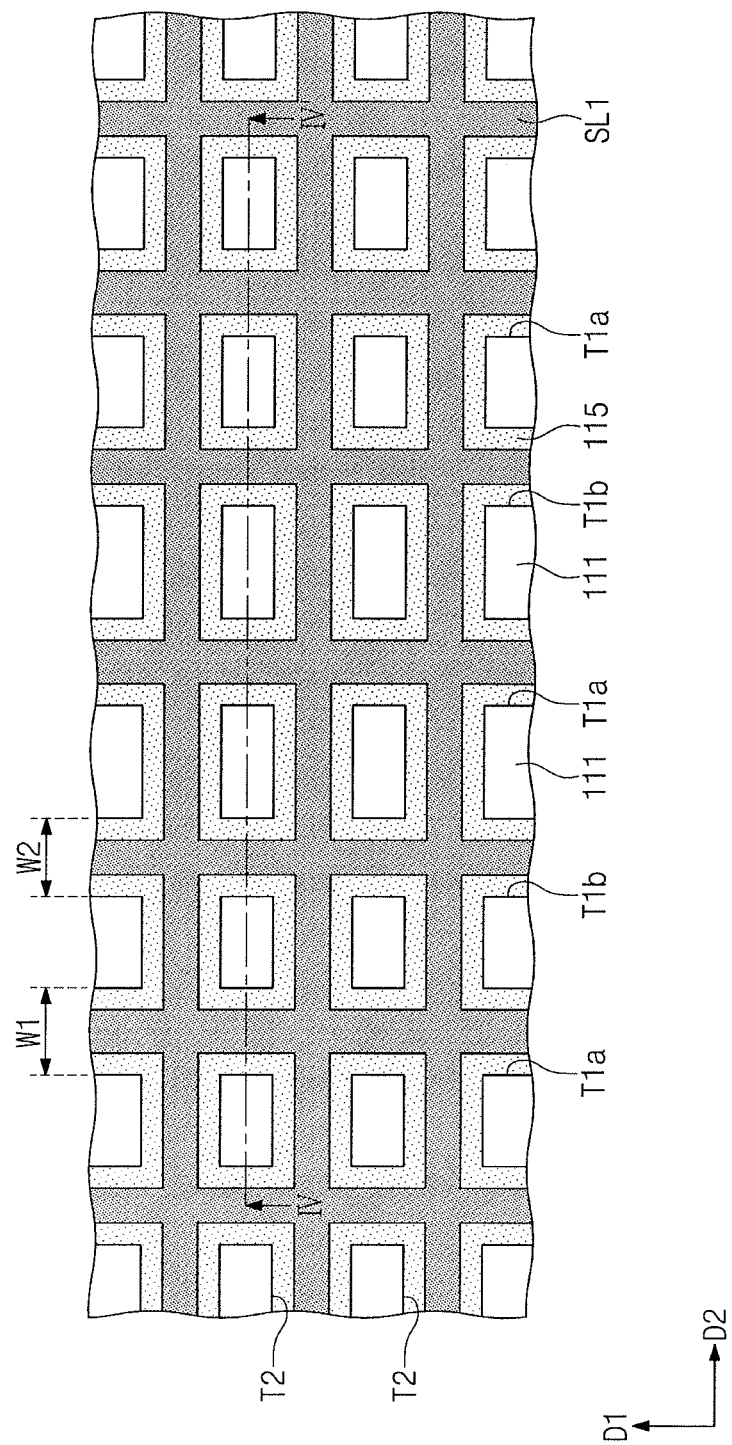
Figure 25B:
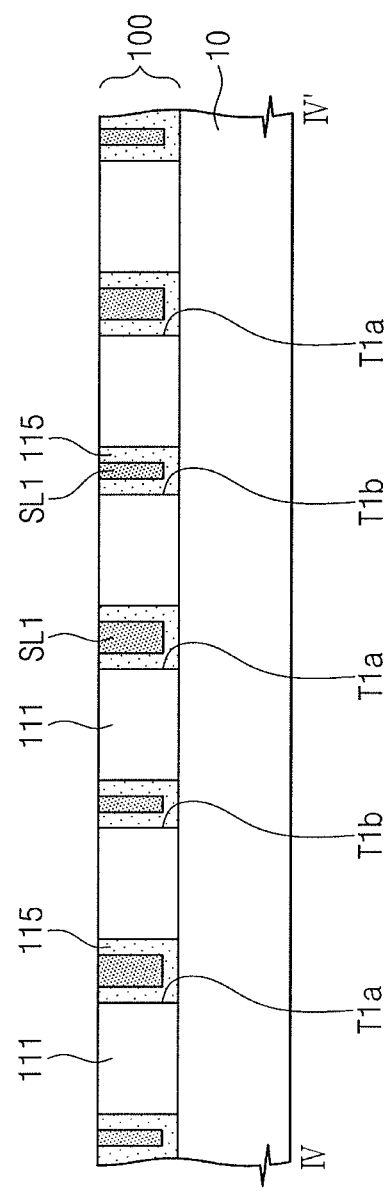

Referring to FIGS. 25A and 25B, a lower mold structure 100 may be formed on a substrate 10. The lower mold structure 100 may include lower insulation patterns 111 spaced apart from each other in first and second directions D1 and D2 on the substrate 10, first connect semiconductor patterns 115 covering sidewalls of the lower insulation patterns 111 and a top surface of the substrate 10, and a first sacrificial layer SL filling gaps defined by the first connect semiconductor patterns 115.

The first connect semiconductor pattern 115 may include a floor segment in contact with a top surface of the substrate 10 and a sidewall segment extending toward sidewalls of first and second horizontal trenches T1a, T1b, and T2. The first connect semiconductor pattern 115 may also have the gap defined by the floor and sidewall segments. The first connect semiconductor pattern 115 may include, for example, single crystalline silicon, polycrystalline silicon, polycrystalline germanium, or single crystalline germanium. In one embodiment, the first connect semiconductor pattern 115 may have a carbon nanostructure, organic semiconductor material, and/or compound semiconductor.

The first sacrificial layer SL1 may include first segments extending in the first direction D1 and second segments extending in the second direction D2. The first and second segments may be integrally combined in a single body. The first sacrificial layer SL1 may be on the first connect semiconductor pattern 115 and may completely fill the first and second horizontal trenches T1a, T1b, and T2. The first sacrificial layer SL1 may include a material having a predetermined etch selectivity to the lower insulation patterns 111 and the first connect semiconductor patterns 115. For example, the first sacrificial layer SL1 may include one or more of a polysilicon layer, a silicon carbide layer, a silicon germanium layer, a silicon oxynitride layer, or a silicon nitride layer.

Formation of the lower mold structure 100 may include forming a lower insulation layer on the substrate 10, patterning the lower insulation layer to form the first and second horizontal trenches T1a, T1b, and T2 crossing each other, forming a connect semiconductor layer to conformally cover the first and second horizontal trenches T1a, T1b, and T2, forming the first sacrificial layer SL1 to fill the first and second horizontal trenches T1a, T1b, and T2, and planarizing the first sacrificial layer SL1 and the connect semiconductor layer to expose the lower insulation layer.

The first horizontal trenches T1a and T1b may extend in the first direction D1 and be spaced apart from each other in the second direction D2. The second horizontal trenches T2 may extend in the second direction D2 and be spaced apart from each other in the first direction D1. The first horizontal trenches T1a and T1b may include first trenches T1a, each of which has a first width W1, and second trenches T1b, each of which has a second width W2 less than the first width W1. In an embodiment, each of the second trenches T1b may be between the first trenches T1a adjacent to each other.

The connect semiconductor layer may be deposited to a uniform thickness on sidewalls and floor surfaces of the first and second horizontal trenches T1a, T1b, and T2. The deposition thickness of the connect semiconductor layer may be less than about half the second width W2 of the second horizontal trench T2. Because the connect semiconductor layer is deposited in the way as described above, the connect semiconductor layer may define the gaps in the first and second horizontal trenches T1a, T1b, and T2. A chemical vapor deposition or atomic layer deposition may be employed to form the connect semiconductor layer, which may be or include, for example, a polycrystalline silicon layer.

Figure 26A:
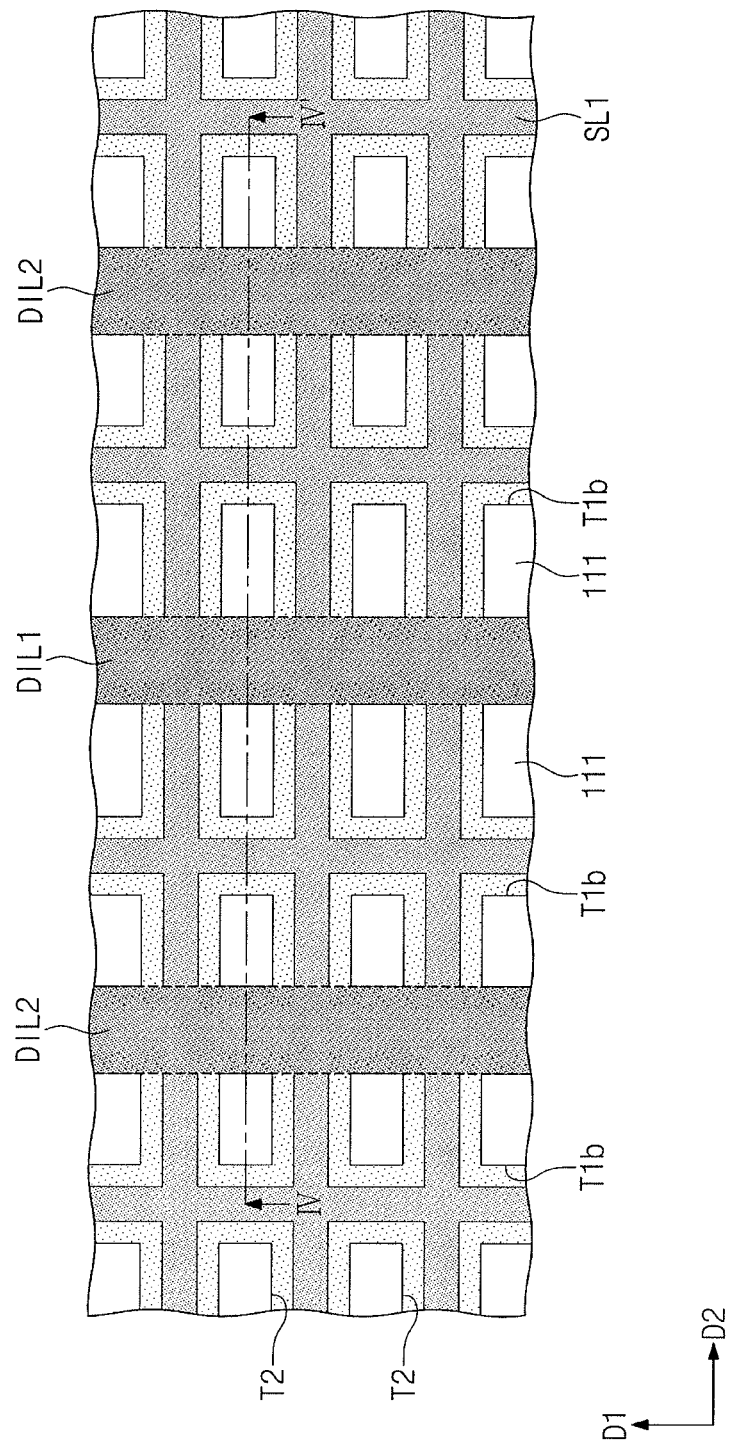
Figure 26B:
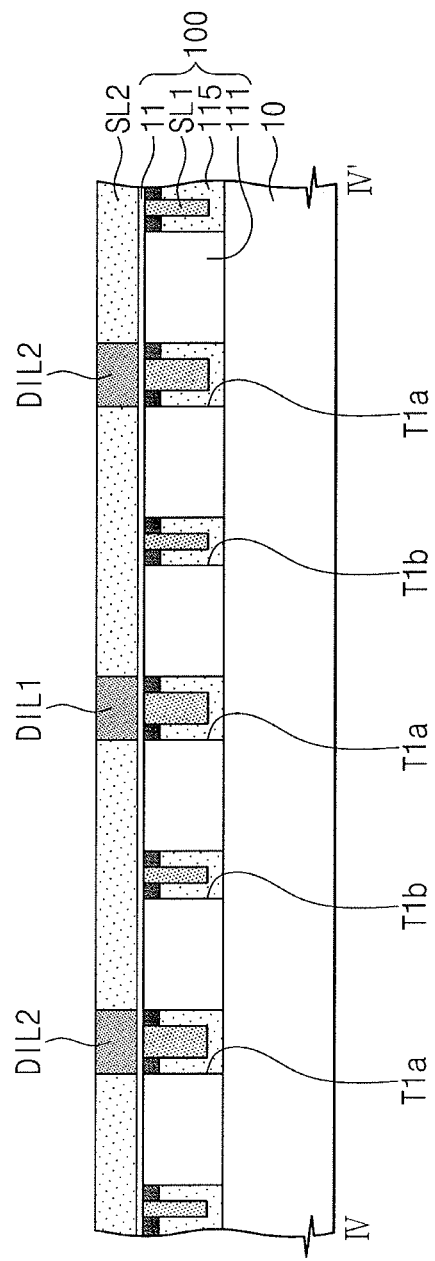

Referring to FIGS. 26A and 26B, a buffer insulation layer 11 and a second sacrificial layer SL2 may be sequentially formed on the lower mold structure 100. In an embodiment, before the buffer insulation layer 11 is formed, a blocking layer may be formed by doping impurities (e.g., carbon) on an upper portion of the first connect semiconductor pattern 115.

The second sacrificial layer SL2 may include one or more of, for example, a polysilicon layer, a silicon carbide layer, a silicon germanium layer, a silicon oxynitride layer, or a silicon nitride layer. In an embodiment, the second sacrificial layer SL2 may be a polysilicon layer with no doped impurities.

First and second dummy impurity layers DIL1 and DIL2 may be formed in the second sacrificial layer SL2 and spaced apart from each other in the second direction D2, while extending in the first direction D1. For example, the first and second dummy impurity layers DIL1 and DIL2 may extend in parallel to the first trenches T1a. In a plan view, the first and second dummy impurity layers DIL1 and DIL2 may overlap the first trenches T1a. The first dummy impurity layer DIL1 may be between the second dummy impurity layers DIL2 adjacent to each other. For example, the first and second dummy impurity layers DIL1 and DIL2 may be formed by implanting impurities (e.g., carbon) in the second sacrificial layer SL2.

Figure 27A:
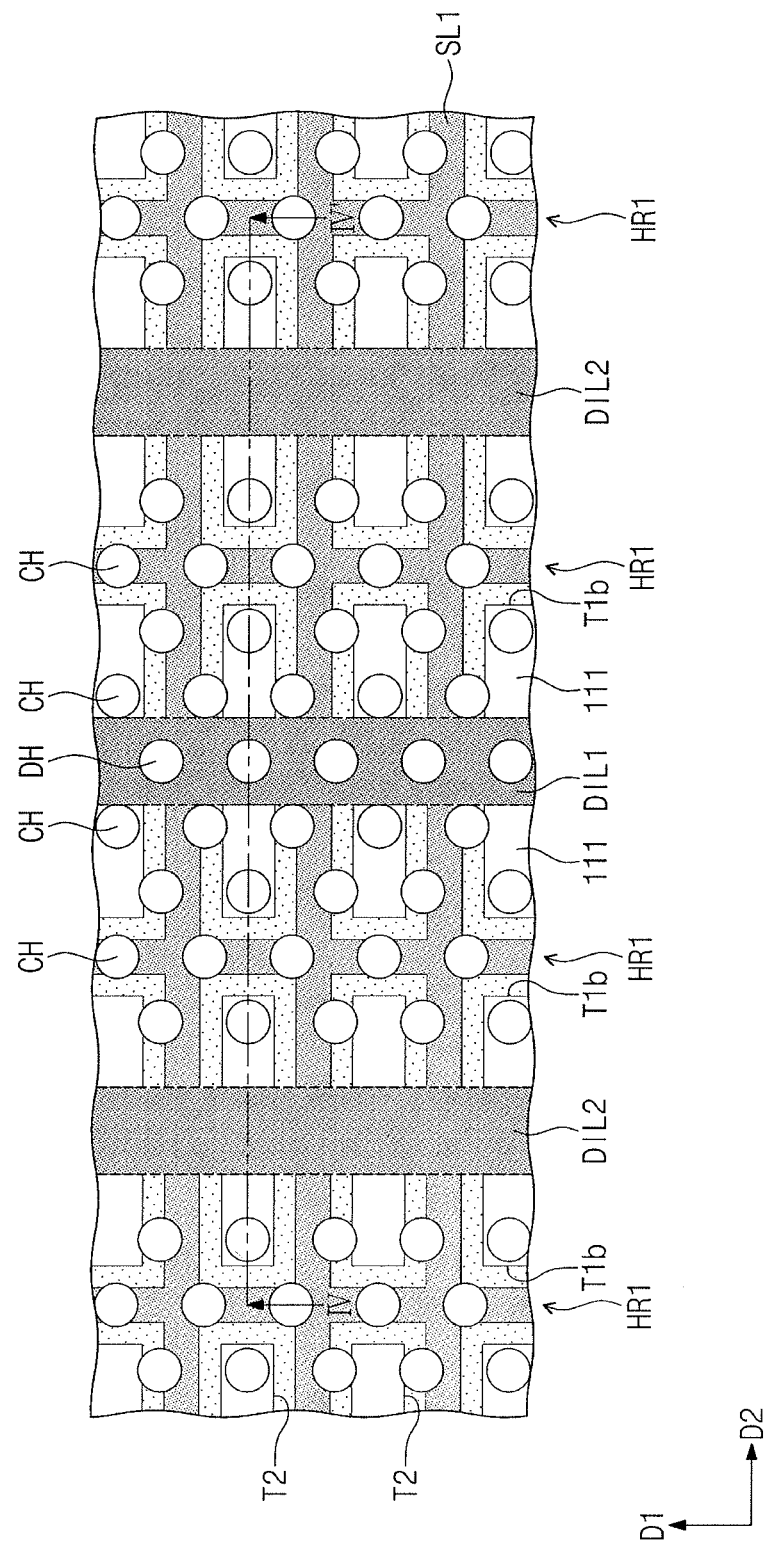
Figure 27B:
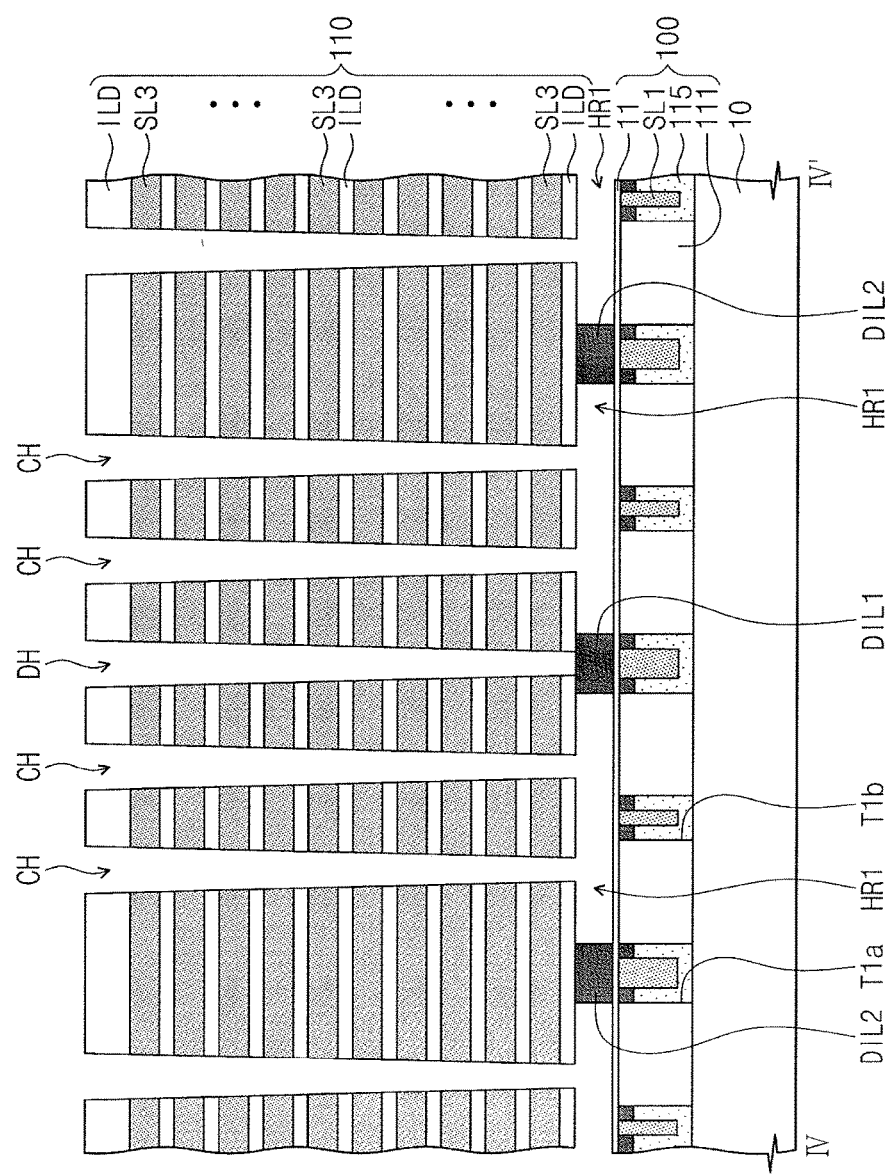

Referring to FIGS. 27A and 27B, a thin-layer structure 110 may be formed to include insulation layers ILD and third sacrificial layers SL3 that are alternately stacked on the second sacrificial layer SL2 including the first and second dummy impurity layers DIL1 and DIL2.

The third sacrificial layers SL3 may include a material having a predetermined etch selectivity to the insulation layers ILD and the second sacrificial layer SL2. For example, the third sacrificial layers SL3 and the insulation layers ILD may exhibit a high etch selectivity to a chemical solution for wet etching and a low etch selectivity to an etch gas for dry etching.

The thin-layer structure 110 may be penetrated with channel holes CH that expose the second sacrificial layer SL2 and with dummy channel holes DCH to expose the first dummy impurity layer DIL1.

First recessions HR1 may be formed by laterally etching portions of the second sacrificial layer SL2 that are exposed to the channel holes CH. The first recessions HR1 may be formed by isotropically etching the second sacrificial layer SL2 using an etch recipe having an etch selectivity to the third sacrificial layers SL3, the insulation layers ILD, and the substrate 10. The first recessions HR1 may therefore be connected to the channel holes CH arranged along the first and second directions D1 and D2.

When the second sacrificial layer SL2 is etched, the first and second dummy impurity layers DIL1 and DIL2 may be used as an etch stop layer, so that the first recession HR1 may expose sidewalls of the first and second dummy impurity layers DIL1 and DIL2. The first and second impurity layers DIL1 and DIL2 may serve as a supporter that supports the thin-layer structure 110.

The second sacrificial layer SL2 may be removed, and then the first connect semiconductor patterns 115 in second trenches T1b may be doped with impurities passing through the channel holes CH and the first recessions HR1. The impurities doped in the first connect semiconductor patterns 115 may have a conductivity opposite to the substrate 10.

Figure 28A:
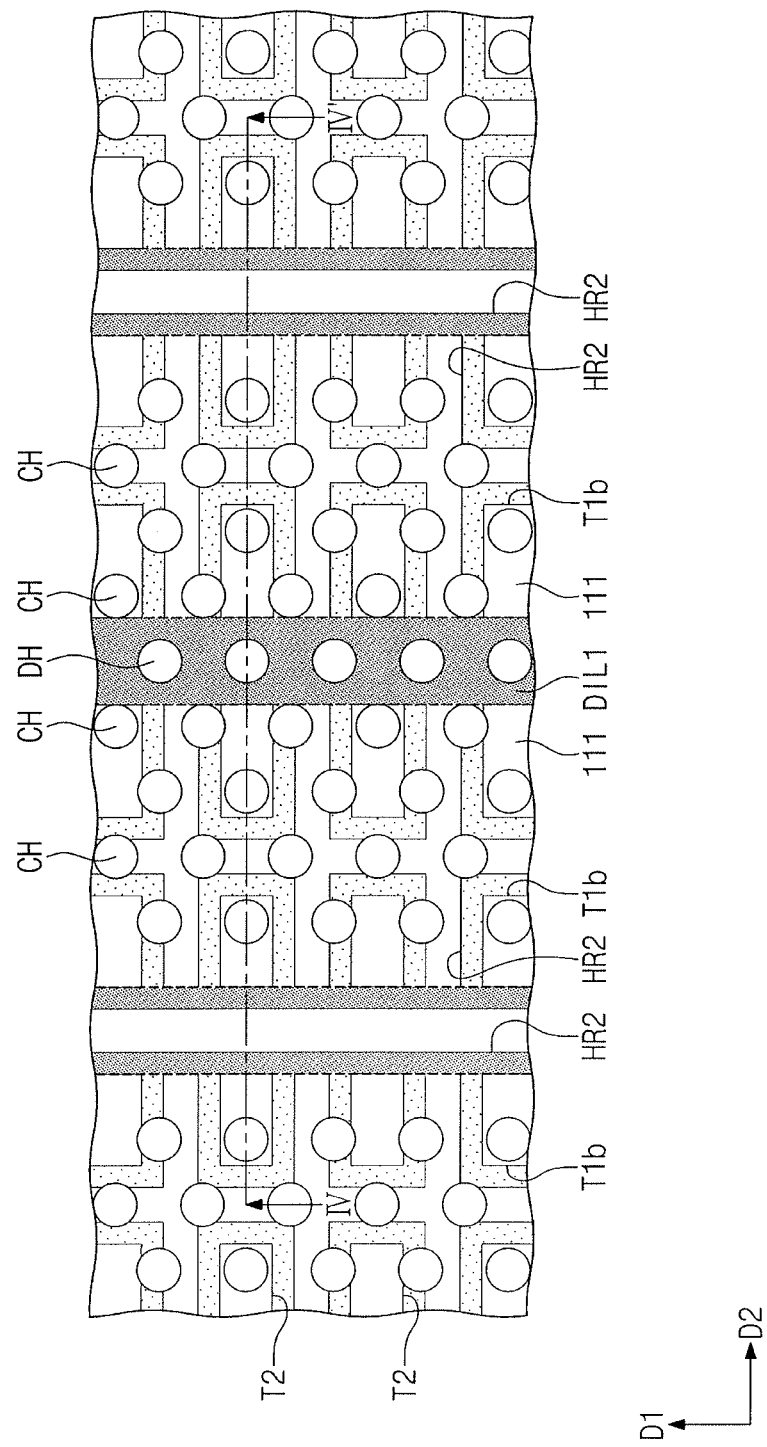
Figure 28B:
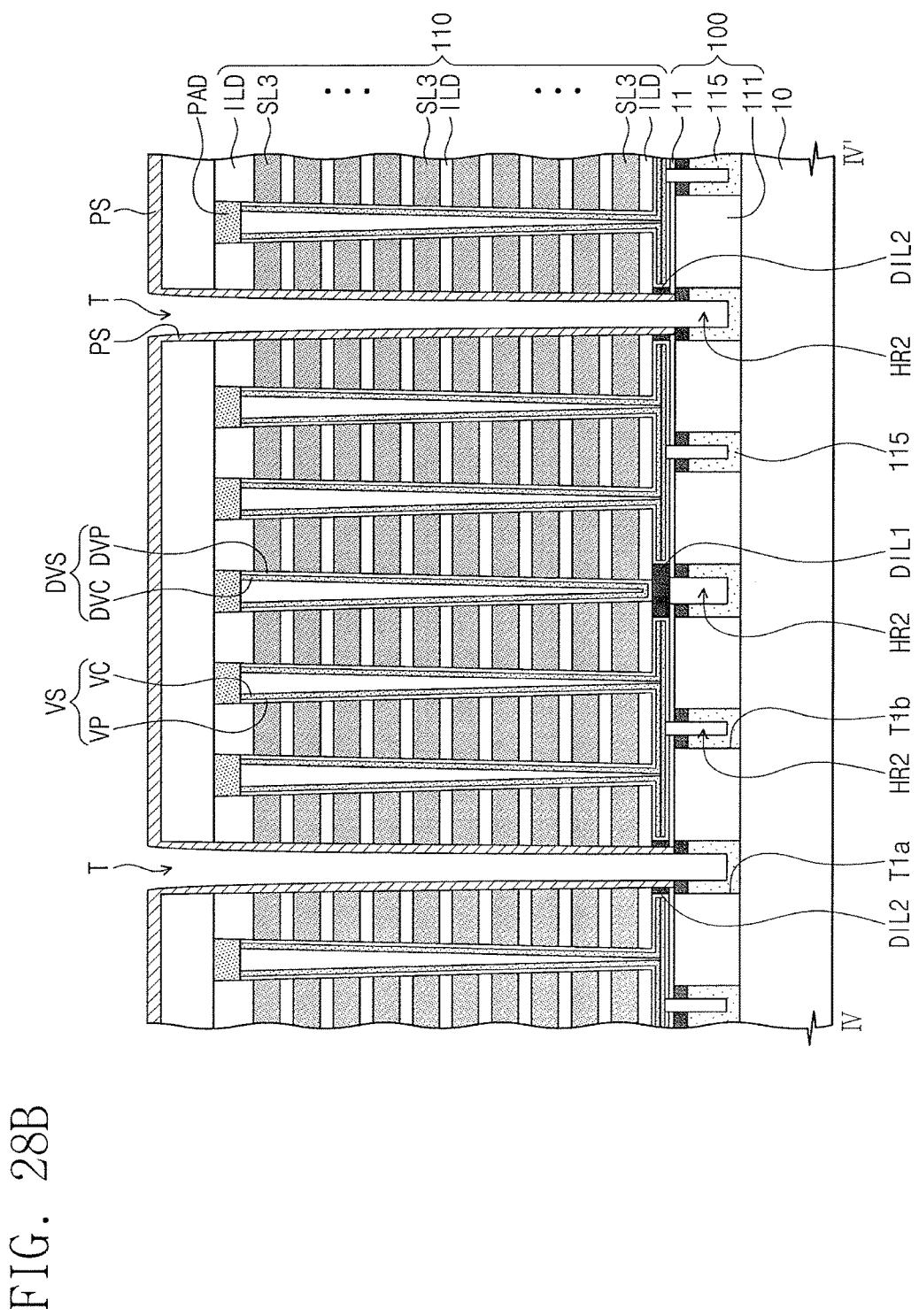

Referring to FIGS. 28A and 28B, channel structures VS may be formed in the first recessions HR1 and the channel holes CH. Dummy channel structures DVS may be formed in the dummy channel holes DCH.

The channel structure VS may include a first vertical insulation pattern VP and a channel pattern VC. The dummy channel structure DVS may include a second vertical insulation pattern DVP and a dummy vertical channel pattern DVC. The first and second vertical insulation layers VP and DVP may include a tunnel insulation layer, a charge storage layer, and a blocking insulation layer that form a data storage layer of a vertical NAND Flash memory device.

In an embodiment, as shown in FIG. 30, the channel structure VS may include a vertical segment P2 perpendicular to the substrate 10 and a horizontal segment P1 parallel to the substrate 10. The vertical segment P2 may be in the channel hole CH. The horizontal segment P1 may be in the first recession HR1. In this configuration, the first vertical insulation pattern VP and the channel pattern VC may horizontally extend from inner walls of the channel holes CH toward inner walls of the first recessions HR1. In the first recessions HR1, the first vertical insulation pattern VP may be in contact with sidewalls of the first and second dummy impurity layers DIL1 and DIL2. The second vertical insulation pattern DVP of the dummy channel structure DVS may extend onto a bottom surface of the dummy vertical channel pattern DVC and a top surface of the first dummy impurity layer DIL1.

After the channel structure VS and the dummy channel structure DVS are formed, a capping insulation layer may be formed on the thin-layer structure 110. Then, the capping insulation layer and the thin-layer structure 110 may be patterned to form vertical trenches T exposing portions of the first sacrificial layer SL. The vertical trench T may extend in the first direction D1 and penetrate the thin-layer structure 110 and the second dummy impurity layer DIL2. In an embodiment, the vertical trenches T may extend in parallel to the second dummy impurity layers DIL2.

After the vertical trenches T are formed, a dummy spacer PS (e.g., see FIG. 28B) may cover sidewalls of the third sacrificial layers SL3 and the insulation layers ILD that are exposed to the vertical trenches T. The dummy spacer PS may be formed of a material having a predetermined etch selectivity to the first sacrificial layer SL and the third sacrificial layers SL3. For example, the dummy spacer PS may be formed by depositing a polysilicon layer on the substrate 10 after the vertical trenches T are formed, and anisotropically etching the polysilicon layer to partially expose the first sacrificial layer SL1.

A second recession HR2 may be formed by isotropically etching the first sacrificial layer SL1 exposed to the vertical trenches T. As the first sacrificial layer SL1 extends along the first and second directions D1 and D2, the second recession HR2 may expose portions of the buffer insulation layer 11.

An etching process may be performed to sequentially etch portions of the buffer insulation layer 11 and the first vertical insulation pattern VP exposed to the second recession HR2, so that the second recession HR2 may partially expose the channel pattern VC of the channel structure VS. The second recession HR2 may also partially expose the first dummy impurity layer DIL1. For example, the first dummy impurity DIL1 may prevent the dummy vertical channel pattern DVC of the dummy channel structure DVS from being exposed to the second recession HR2.

Figure 29A:
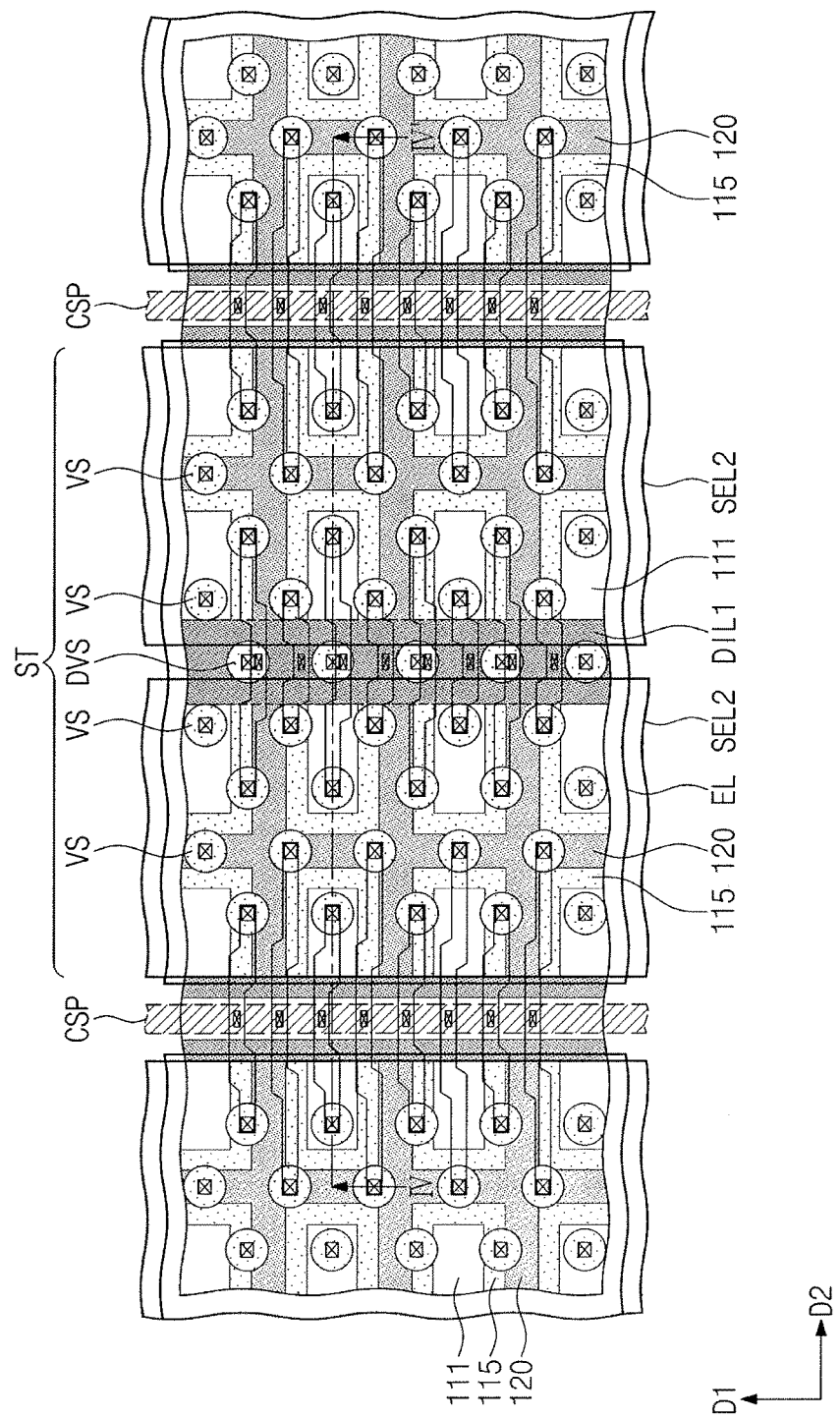
Figure 29B:
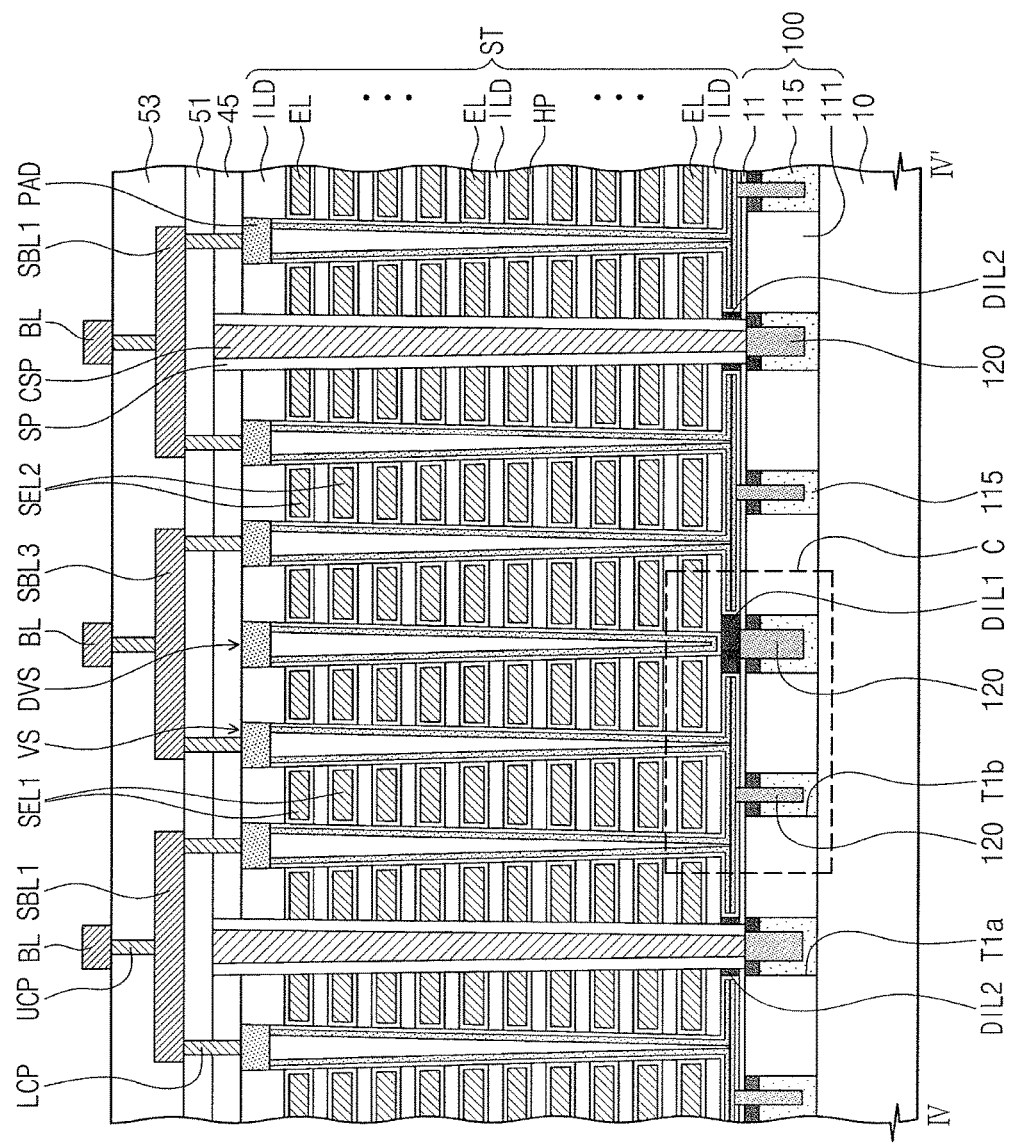
Figure 30:
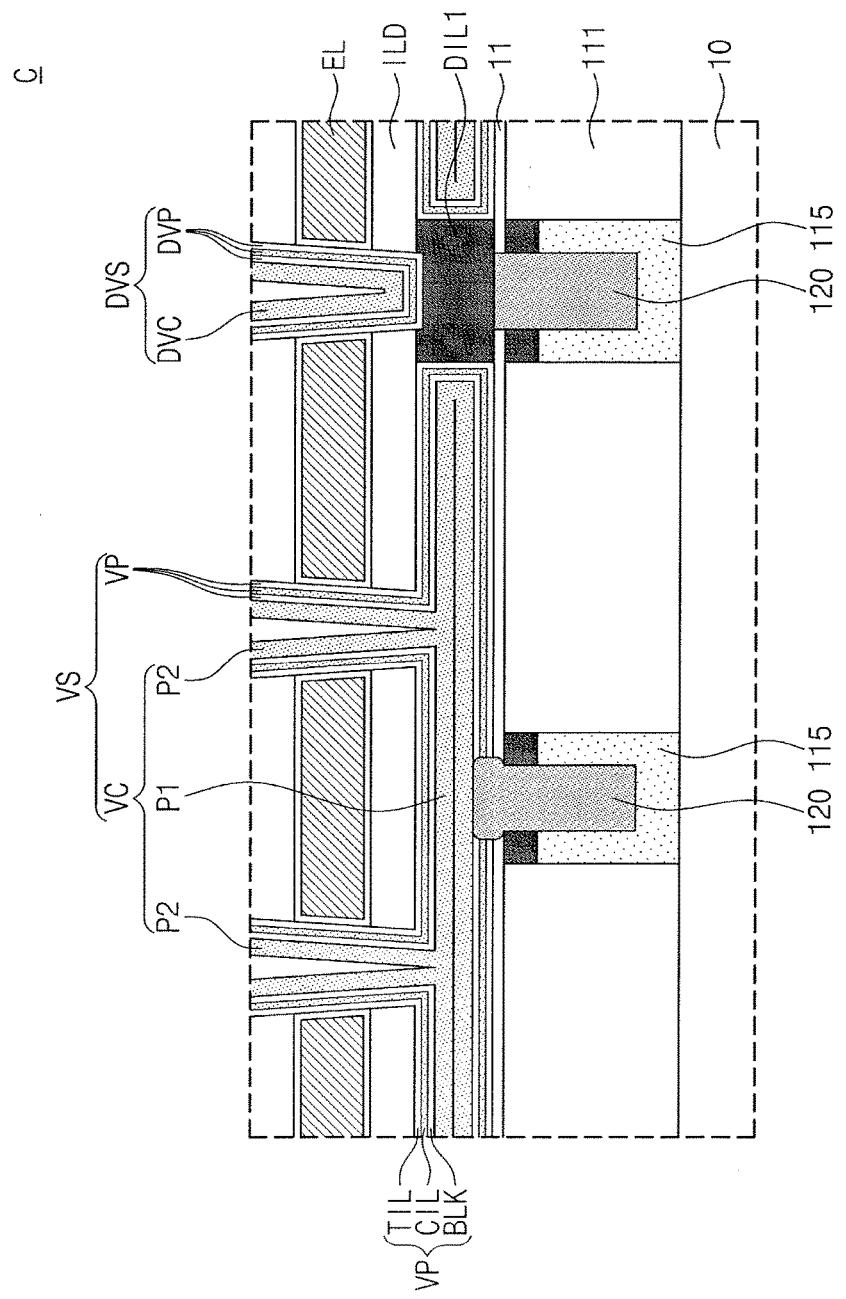
FIG. 30 illustrates an enlarged view embodiment of section C in FIG. 29B.

Referring to FIGS. 29A, 29B, and 30, a second connect semiconductor pattern 120 may be formed to fill the second recession HR2. The second connect semiconductor pattern 120 may electrically connect the first connect semiconductor pattern 115 to a semiconductor pattern exposed to the second recession HR2. For example, in an embodiment, a semiconductor pattern of the channel structure VS may be electrically connected to the substrate 10 through the first and second connect semiconductor patterns 115 and 120. The second connect semiconductor pattern 120 may fill the second recession HR2 and thus extend in the first and second directions D1 and D2. The first dummy impurity layer DIL1 may electrically separate the substrate 10 from the dummy vertical channel pattern DVC of the dummy channel structure DVS.

After the second connect semiconductor pattern 120 is formed, the dummy spacers PS may be removed from the vertical trenches T. As a result, the sidewalls of the third sacrificial layers SL3 and the insulation layers ILD may be exposed to the vertical trenches T. The third sacrificial layers SL3 may be replaced with electrodes EL. Thus, an electrode structure ST may be formed to include the electrodes EL vertically stacked on the substrate 10.

Common source regions may be formed by doping impurities in the first and second connect semiconductor patterns 115 and 120 exposed to the vertical trenches T. A common source plug CSP may be formed to connect with the first and second connect semiconductor patterns 115 and 120.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A three-dimensional semiconductor memory device, comprising:
   common source regions spaced apart from each other in a substrate and extending in a first direction;
   an electrode structure between the common source regions adjacent to each other and extending in the first direction, the electrode structure including electrodes vertically stacked on the substrate;
   first channel structures penetrating the electrode structure and including a first semiconductor pattern and a first vertical insulation layer; and
   second channel structures between the first channel structures adjacent to each other and penetrating the electrode structure, the second channel structures including a second semiconductor pattern and a second vertical insulation layer, wherein the second vertical insulation layer surrounds the second semiconductor pattern and extends between the substrate and a bottom surface of the second semiconductor pattern, and wherein the second vertical insulation layer has a bottom surface lower than a bottom surface of the first vertical insulation layer.

2. The device as claimed in claim 1, wherein:
   the first channel structures are spaced apart from the common source regions by a first horizontal distance, and
   the second channel structures are spaced apart from the common source regions by a second horizontal distance greater than the first horizontal distance.

3. The device as claimed in claim 1, further comprising:
   a dummy impurity layer between the common source regions adjacent to each other and extending in the first direction, wherein the second channel structures are on the dummy impurity layer.

4. The device as claimed in claim 3, wherein a portion of the second vertical insulation layer is between the dummy impurity layer and the bottom surface of the second semiconductor pattern.

5. The device as claimed in claim 1, further comprising:
   first and second string selection electrodes extending in the first direction and horizontally spaced apart from each other on the electrode structure, wherein the first channel structures vertically extend to penetrate the first and second string selection electrodes, and wherein the second channel structures vertically extend between the first and second string selection electrodes.

6. The device as claimed in claim 1, wherein upper widths of the first channel structures and upper widths of the second channel structures are equal.

7. The device as claimed in claim 1, further comprising:
   lower semiconductor patterns,
   wherein each of the lower semiconductor patterns is between the substrate and one of the first channel structures, and wherein the first vertical insulation layer and the first semiconductor pattern are in contact with the lower semiconductor pattern.

8. A three-dimensional semiconductor memory device, comprising:
   first impurity layers extending in a first direction and spaced apart from each other, the first impurity layers including first impurities;

a second impurity layer extending in the first direction between the first impurity layers adjacent to each other, the second impurity layer including second impurities different from the first impurities;

an electrode structure between the first impurity layers adjacent to each other and covering the second impurity layer, the electrode structure including a plurality of electrodes vertically stacked on a substrate;

first channel structures on the substrate between the first impurity layers and penetrating the electrode structure; and second channel structures on the second impurity layer and penetrating the electrode structure.

9. The device as claimed in claim 8, wherein each of the first channel structures includes:

a lower semiconductor pattern penetrating a lower portion of the electrode structure and in contact with the substrate;

an upper semiconductor pattern penetrating an upper portion of the electrode structure and in contact with the lower semiconductor pattern; and a first vertical insulation layer surrounding the upper semiconductor pattern on the lower semiconductor pattern.

10. The device as claimed in claim 8, wherein:

each of the second channel structures includes a second vertical insulation layer surrounding a second semiconductor pattern, the second vertical insulation layer extends between a second dummy impurity layer and a bottom surface of the second semiconductor pattern.

11. The device as claimed in claim 10, wherein:

each of the second channel structures includes a dummy semiconductor pattern on the second impurity layer, a portion of the second vertical insulation layer extends between the dummy semiconductor pattern and the bottom surface of the second semiconductor pattern.

12. The device as claimed in claim 8, wherein:

the first channel structures are spaced apart from the first impurity layers by a first horizontal distance, and the second channel structures are spaced apart from the first impurity layers by a second horizontal distance greater than the first horizontal distance.

13. The device as claimed in claim 8, further comprising:

first and second string selection electrodes extending in the first direction and horizontally spaced apart from each other on the electrode structure, wherein the first channel structures vertically extend to penetrate the first and second string selection electrodes, and wherein the second channel structures vertically extend between the first and second string selection electrodes.

14. The device as claimed in claim 8, wherein:

the first channel structures are electrically connected to the substrate, and the second channel structures are electrically separated from the substrate.

15. A three-dimensional semiconductor memory device, comprising:

common source regions spaced apart from each other in a substrate and extending in a first direction;

an electrode structure on the substrate between the common source regions adjacent to each other and including electrodes vertically stacked on the substrate;

first channel structures penetrating the electrode structure and electrically connected to the substrate; and second channel structures between the first channel structures adjacent to each other and penetrating the electrode structure and electrically separated from the substrate, wherein each of the first channel structures includes:

a lower semiconductor pattern penetrating a lower portion of the electrode structure and in contact with the substrate;

an upper semiconductor pattern penetrating an upper portion of the electrode structure and in contact with the lower semiconductor pattern; and a first vertical insulation layer surrounding the upper semiconductor pattern on the lower semiconductor pattern.

16. The device as claimed in claim 15, wherein:

the first channel structures are spaced apart from the common source regions by a first horizontal distance, and the second channel structures are spaced apart from the common source regions by a second horizontal distance greater than the first horizontal distance.

17. The device as claimed in claim 15, wherein each of the second channel structures includes:

a second semiconductor pattern penetrating the electrode structure; and a second vertical insulation layer surrounding the second semiconductor pattern and extending onto a bottom surface of the second semiconductor pattern.

18. The device as claimed in claim 17, wherein the first vertical insulation layer has a bottom surface higher than a bottom surface of the second vertical insulation layer.

19. The device as claimed in claim 17, wherein:

each of the second channel structures includes a dummy semiconductor pattern in contact with the substrate, a portion of the second vertical insulation layer is between the dummy semiconductor pattern and the bottom surface of the second semiconductor pattern.

20. The device as claimed in claim 15, further comprising:

a dummy impurity layer between the common source regions adjacent to each other while extending in the first direction, wherein the second channel structures are in contact with the dummy impurity layer.

* * * * *